(12) United States Patent
Yamashita et al.

(10) Patent No.: US 12,322,656 B2
(45) Date of Patent: Jun. 3, 2025

(54) SUBSTRATE LASER PROCESSING METHOD AND SUBSTRATE LASER PROCESSING APPARATUS

(71) Applicant: Tokyo Electron Limited, Tokyo (JP)

(72) Inventors: Yohei Yamashita, Kumamoto (JP);
Hayato Tanoue, Kumamoto (JP);
Yasutaka Mizomoto, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 413 days.

(21) Appl. No.: 17/788,776

(22) PCT Filed: Dec. 9, 2020

(86) PCT No.: PCT/JP2020/045884
§ 371 (c)(1),
(2) Date: Jun. 24, 2022

(87) PCT Pub. No.: WO2021/131711
PCT Pub. Date: Jul. 1, 2021

(65) Prior Publication Data
US 2023/0023577 A1  Jan. 26, 2023

(30) Foreign Application Priority Data

Dec. 26, 2019 (JP) .................................. 2019-236190
Jan. 28, 2020 (JP) .................................. 2020-011824

(51) Int. Cl.
*H01L 21/78* (2006.01)
*H01L 21/268* (2006.01)
*H01L 21/67* (2006.01)

(52) U.S. Cl.
CPC ........ *H01L 21/7806* (2013.01); *H01L 21/268* (2013.01); *H01L 21/67115* (2013.01)

(58) Field of Classification Search
CPC .............. H01L 21/7806; H01L 21/268; H01L 21/67115; H01L 33/0093; H01L 21/67092;
(Continued)

(56) References Cited

U.S. PATENT DOCUMENTS

2002/0146893 A1* 10/2002 Shimoda ............... G02F 1/1368
257/E27.111
2015/0221818 A1*  8/2015 Morikazu ............. H01S 5/0216
438/22
2017/0125268 A1   5/2017 Dang

FOREIGN PATENT DOCUMENTS

JP        H10-125931 A    5/1998
JP        H10125929 A     5/1998
(Continued)

OTHER PUBLICATIONS

International Search Report of PCT/JP2020/045884 dated Mar. 16, 2021.

*Primary Examiner* — John P. Dulka
(74) *Attorney, Agent, or Firm* — Shih IP Law Group, PLLC.

(57) ABSTRACT

A substrate processing method of transcribing, in a combined substrate in which a first substrate and a second substrate are bonded to each other, a device layer formed on a surface of the second substrate to the first substrate is provided. A laser beam is radiated in a pulse shape from a rear surface side of the second substrate to a laser absorption layer formed between the second substrate and the device layer.

27 Claims, 20 Drawing Sheets

(58) Field of Classification Search
CPC ............ B23K 26/0823; B23K 2101/40; B23K 2103/56; B23K 26/0622; B23K 26/18; B23K 26/57
See application file for complete search history.

(56) References Cited

FOREIGN PATENT DOCUMENTS

| | | | |
|---|---|---|---|
| JP | 2006135251 | A | 5/2006 |
| JP | 2007220749 | A | 8/2007 |
| JP | 2007-534164 | A | 11/2007 |
| JP | 2010-247189 | A | 11/2010 |
| JP | 2013004578 | A | 1/2013 |
| JP | 2013125764 | A | 6/2013 |
| JP | 2015144192 | A | 8/2015 |
| JP | 2017084910 | A | 5/2017 |
| JP | 2018174084 | A | 11/2018 |
| WO | 2005094320 | A2 | 10/2005 |

* cited by examiner

SUBSTRATE LASER PROCESSING METHOD AND SUBSTRATE LASER PROCESSING APPARATUS

CROSS-REFERENCE TO RELATED APPLICATIONS

This Application is a U.S. national phase application under 35 U.S.C. § 371 of PCT Application No. PCT/JP2020/045884 filed on Dec. 9, 2020, which claims the benefit of Japanese Patent Application No. 2019-236190 filed on Dec. 26, 2019 and Japanese Patent Application No. 2020-011824 filed on Jan. 28, 2020, the entire disclosures of which are incorporated herein by reference.

TECHNICAL FIELD

The various aspects and exemplary embodiments described herein pertain generally to a substrate processing method and a substrate processing apparatus.

BACKGROUND

Patent Document 1 discloses a method of manufacturing a semiconductor device. The method of manufacturing the semiconductor device includes a heating process of radiating a $CO_2$ laser from a rear surface of a semiconductor substrate to locally heat a separation oxide film, and a transcription process of causing separation in the separation oxide film and/or at the interface between the separation oxide film and the semiconductor substrate to transcribe a semiconductor device to a transcription destination substrate.

PRIOR ART DOCUMENT

Patent Document 1: Japanese Patent Laid-open Publication No. 2007-220749

DISCLOSURE OF THE INVENTION

Means for Solving the Problems

In one exemplary embodiment, there is provided a substrate processing method of transcribing, in a combined substrate in which a first substrate and a second substrate are bonded to each other, a device layer formed on a surface of the second substrate to the first substrate. A laser beam is radiated in a pulse shape from a rear surface side of the second substrate to a laser absorption layer formed between the second substrate and the device layer.

DETAILED DESCRIPTION

Recently, in a manufacturing process of LEDs, a so-called laser lift-off processing is performed in which a GaN (gallium nitride)-based compound crystal layer (material layer) is separated from a sapphire substrate using a laser beam. The reason for performing the laser lift-off processing is as follows. Since the sapphire substrate has transmittance to a short wavelength laser beam (for example, UV light), a short wavelength laser beam having a high absorptivity for an absorption layer can be used. Therefore, a wide choice of laser beams can be allowed.

Meanwhile, in a manufacturing process of semiconductor devices, a device layer formed on a surface of one substrate (silicon substrate such as semiconductor) is transcribed to another substrate. In general, a silicon substrate has transmittance to a laser beam in the NIR (near infrared) range, and an absorption layer also has transmittance to the laser beam in the NIR range. Therefore, the device layer can be damaged. Accordingly, in order to perform the laser lift-off processing in the manufacturing process of semiconductor devices, a laser beam in the FIR (far infrared) range is used.

In general, for example, a $CO_2$ laser may be used as the laser beam having the FIR wavelength. In the method described above in Patent Document 1, radiation of the $CO_2$ laser to the separation oxide film causes the separation at the interface between the separation oxide film and the substrate.

Figure 1:
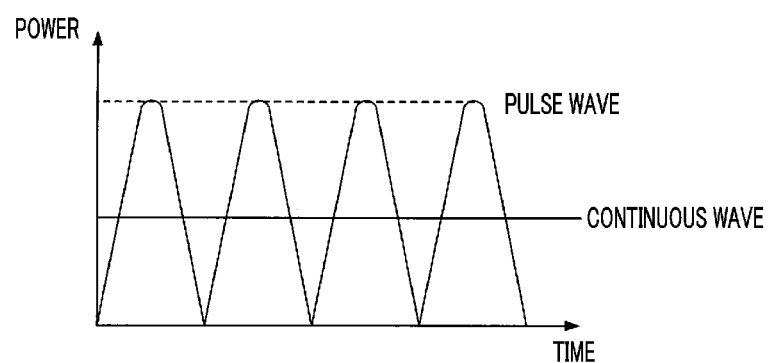
FIG. 1 is an explanatory diagram comparing a power of a laser beam when a pulse wave and a continuous wave are used.

Here, as a result of intensive examination by the inventors, it is found that the separation may not occur simply by radiating the $CO_2$ laser. That is, it is found that the separation occurs not depending on the energy amount of the $CO_2$ laser but depending on the peak power (maximum intensity of the laser beam). For example, as shown in FIG. 1, when the $CO_2$ laser is continuously oscillated (when a continuous wave is used), it is difficult to increase the peak power, and, thus, the separation may not occur. When the $CO_2$ laser is oscillated in a pulse shape (when a pulse wave is used), it is possible to increase the peak power, and, thus, the separation may occur. In the present disclosure, the laser beam that oscillates the $CO_2$ laser in the pulse shape is a so-called pulsed laser, and its power varies repeatedly between 0 (zero) and a maximum value.

Further, when the $CO_2$ laser is continuously oscillated, the laser lift-off may not be stably performed due to a large thermal influence. Thus, the device layer may be damaged by heat. Therefore, from this point of view, it is preferable to radiate the $CO_2$ laser in the pulse shape.

As described above, in order to separate the separation oxide film (device layer) from the substrate, it is necessary to irradiate the separation oxide film with the $CO_2$ laser in the pulse shape. However, according to the method of Patent Document 1, the pulsed laser is not considered at all and there is no suggestion thereof. Therefore, the conventional method of transcribing the device layer needs to be improved.

According to the present disclosure, in a combined substrate in which a first substrate and a second substrate are bonded to each other, a device layer formed on a surface of the second substrate is appropriately transcribed to the first substrate. Hereinafter, a wafer processing system including a laser radiation device as a substrate processing apparatus and a wafer processing method as a substrate processing method according to the present exemplary embodiment will be described with reference to the drawings. Further, in the present specification and the drawings, substantially the same functional components will be denoted by the same reference numerals and redundant descriptions thereof will be omitted.

Figure 2:
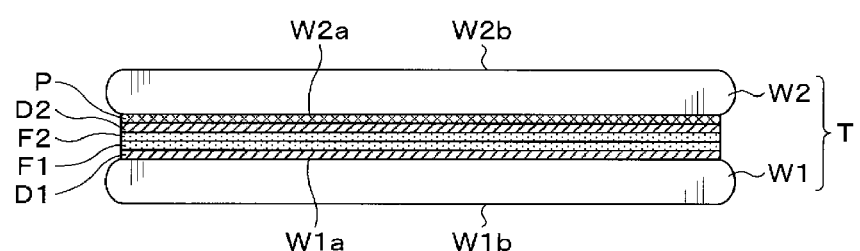
FIG. 2 is a side view schematically illustrating a configuration of a combined wafer to be processed in a wafer processing system.

As will be described below, a wafer processing system 1 according to the present exemplary embodiment performs a processing onto a combined wafer T as a combined substrate in which a first wafer W1 as a first substrate and a second wafer W2 as a second substrate are bonded to each other, as shown in FIG. 2. Hereinafter, a surface of the first wafer W1 to be bonded to the second wafer W2 will be referred to as a front surface W1a and a surface opposite to the front surface W1a will be referred to as a rear surface W1b. Likewise, a surface of the second wafer W2 to be bonded to the first wafer W1 will be referred to as a front surface W2a and a surface opposite to the front surface W2a will be referred to as a rear surface W2b.

The first wafer W1 is a semiconductor wafer such as a silicon substrate. A device layer D1 and a front surface film F1 are stacked on the front surface W1a of the first wafer W1 in this order from the front surface W1a. The device layer D1 includes a plurality of devices. Examples of the front surface film F1 may include an oxide film ($SiO_2$ film, TEOS film), an SiC film, an SiCN film or an adhesive. The device layer D1 and the front surface film F1 may not be formed on the front surface W1a.

The second wafer W2 is also a semiconductor wafer such as a silicon substrate. A laser absorption layer P, a device layer D2 and a front surface film F2 are stacked on the front surface W2a of the second wafer W2 in this order from the front surface W2a. The laser absorption layer P is configured to absorb a laser beam radiated from a laser radiation unit 110, as will be described later. For example, an oxide film ($SiO_2$ film) is used as the laser absorption layer P. However, the laser absorption layer P is not particularly limited as long as it absorbs the laser beam. The device layer D2 and the front surface film F2 are the same as the device layer D1 and the front surface film F1, respectively, of the first wafer W1. Further, the front surface film F1 of the first wafer W1 and the front surface film F2 of the second wafer W2 are bonded to each other. The position of the laser absorption layer P is not limited to the above-described exemplary embodiment. For example, the laser absorption layer P may be formed between the device layer D2 and the front surface film F2. The device layer D2 and the front surface film F2 may not be formed on the front surface W2a. In this case, the laser absorption layer P is formed on the first wafer W1 and the device layer D1 of the first wafer W1 is transcribed to the second wafer W2.

Figure 3:
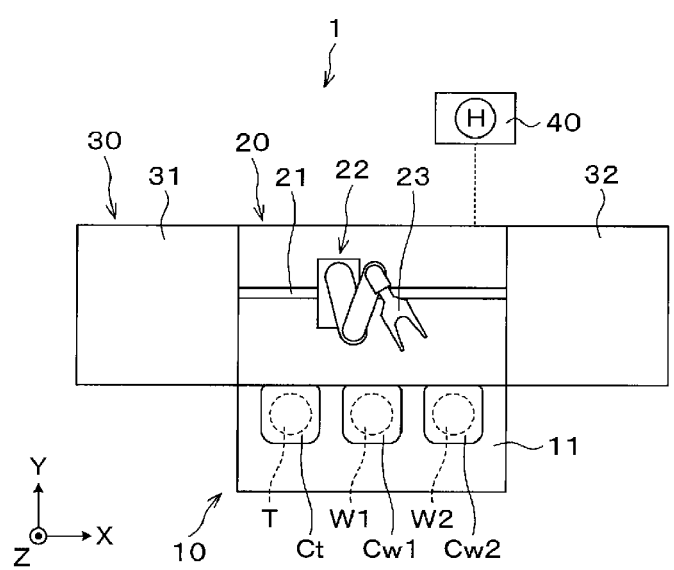
FIG. 3 is a plan view schematically illustrating a configuration of the wafer processing system.

As shown in FIG. 3, the wafer processing system 1 includes a carry-in/out block 10, a transfer block 20 and a processing block 30 which are connected as one body. The carry-in/out block 10 and the processing block 30 are provided around the transfer block 20. Specifically, the carry-in/out block 10 is provided on a negative Y-axis direction side of the transfer block 20. A laser radiation device 31 of the processing block 30 is provided on a negative X-axis direction side of the transfer block 20 and a cleaning device 32 to be described later is provided on a positive X-axis direction side of the transfer block 20.

Cassettes Ct, Cw1 and Cw2 configured to accommodate a plurality of combined wafers T, a plurality of first wafers W1 and a plurality of second wafers W2, respectively, are carried in/out between the carry-in/out block 10 and, for example, the outside. A cassette placing table 11 is provided in the carry-in/out block 10. In the illustrated example, a plurality of, for example, three cassettes Ct, Cw1 and Cw2 can be placed in a row in an X-axis direction on the cassette placing table 11. The number of cassettes Ct, Cw1 and Cw2 placed on the cassette placing table 11 is not limited to the present exemplary embodiment, but can be arbitrarily determined.

The transfer block 20 is provided with a wafer transfer device 22 which is movable along a transfer path 21 elongated in the X-axis direction. The wafer transfer device 22 has, for example, two transfer arms 23 and 23 which hold and transfer the combined wafer T, the first wafer W1 and the second wafer W2. Each transfer arm 23 is movable in a horizontal direction, in a vertical direction, around a horizontal axis and around a vertical axis. The configuration of the transfer arm 23 is not limited to the present exemplary embodiment, but can be arbitrarily determined. Also, the wafer transfer device 22 is configured to transfer the combined wafer T, the first wafer W1 and the second wafer W2 to the cassettes Ct, Cw1 and Cw2 on the cassette placing table 11, the laser radiation device 31 and the cleaning device 32.

The processing block 30 is equipped with the laser radiation device 31 and the cleaning device 32. The laser radiation device 31 radiates a laser beam to the laser absorption layer P of the second wafer W2. The configuration of the laser radiation device 31 will be described later.

The cleaning device 32 cleans a front surface of the laser absorption layer P formed on the front surface W1a of the first wafer W1 separated by the laser radiation device 31. For example, the cleaning device 32 scrub-cleans the front surface by bringing a brush into contact with the front surface of the laser absorption layer P. A pressurized cleaning solution may be used to clean the front surface. Also, the cleaning device 32 may be configured to clean the rear surface W1b as well as the front surface W1a of the first wafer W1.

The above-described wafer processing system 1 is provided with a control device 40 as a controller. The control device 40 is, for example, a computer, and is provided with a program storage (not shown). The program storage stores a program that controls a processing of the combined wafer T in the wafer processing system 1. Also, the program storage stores a program for controlling operations of a driving unit such as the above-described processing devices and transfer devices to implement a wafer processing, which will be described below, in the wafer processing system 1. Further, the program is recorded in a computer-readable recording medium H and may be installed on the control device 40 from the recording medium H.

Hereinafter, the laser radiation device 31 will be described.

Figure 4:
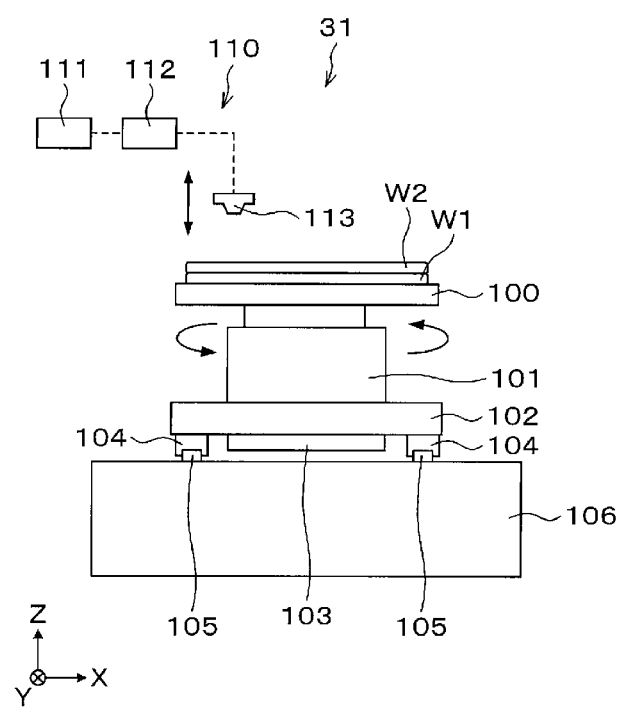
FIG. 4 is a side view schematically illustrating a configuration of a laser radiation device according to the present exemplary embodiment.
Figure 5:
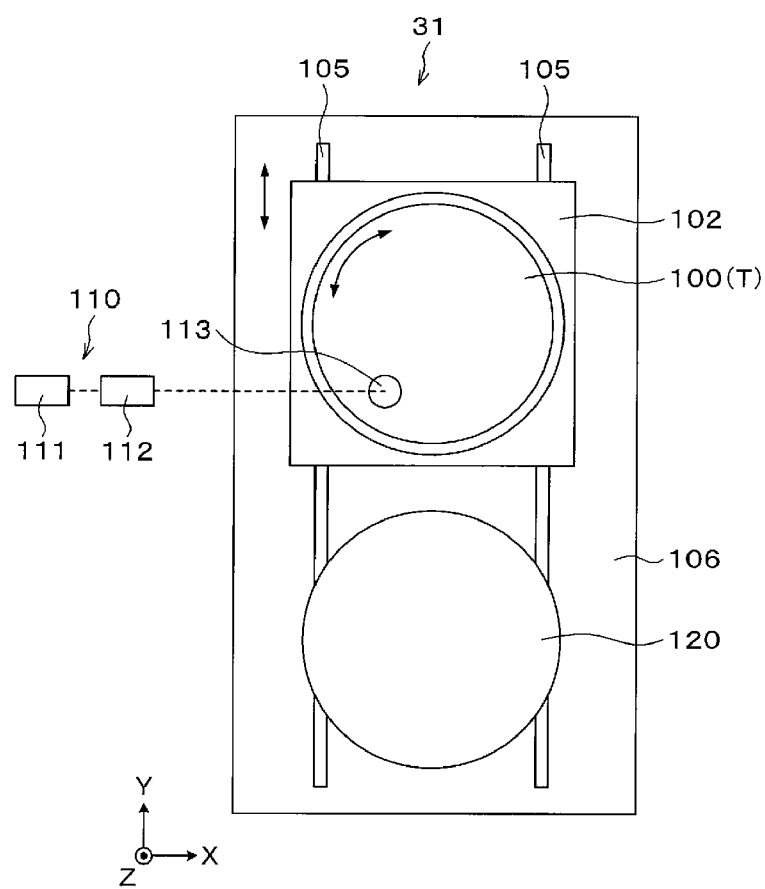
FIG. 5 is a plan view schematically illustrating the configuration of the laser radiation device according to the present exemplary embodiment.

As shown in FIG. 4 and FIG. 5, the laser radiation device 31 includes a chuck 100 as a holder configured to hold the combined wafer T on an upper surface thereof. The chuck 100 is configured to attract and hold the entire rear surface W1b of the first wafer W1. The chuck 100 may attract and hold a part of the rear surface W1b. The chuck 100 is provided with an elevating pin (not shown) configured to support and elevate the combined wafer T from below. The elevating pin is inserted into a through-hole (not shown) formed through the chuck 100, and is configured to be movable up and down.

The chuck 100 is supported on a slider table 102 via an air bearing 101 therebetween. A rotation mechanism 103 is provided at a bottom surface of the slider table 102. The rotation mechanism 103 incorporates therein, for example, a motor as a driving source. The chuck 100 is configured to be rotatable around a 0 axis (vertical axis) by the rotation mechanism 103 via the air bearing 101 therebetween. The slider table 102 is configured to be movable by a movement mechanism 104, which is provided at the bottom surface thereof, along a rail 105 which is provided on a base 106 and elongated in a Y-axis direction. Further, although not particularly limited, a driving source of the movement mechanism 104 may be, for example, a linear motor.

The laser radiation unit 110 is provided above the chuck 100. The laser radiation unit 110 includes a laser head 111, an optical system 112 and a lens 113. The laser head 111 is configured to oscillate a laser beam in a pulse shape. The optical system 112 controls intensity and a position of the laser beam, or adjusts the output by attenuating the laser beam. The lens 113 is a cylindrical member and is configured to radiate the laser beam to the combined wafer T held by the chuck 100. In the present exemplary embodiment, the laser beam is a $CO_2$ laser beam, and the laser beam output from the laser radiation unit 110 is transmitted through the second wafer W2 to be radiated to the laser absorption layer P. Also, a wavelength of the $CO_2$ laser beam is, for example, 8.9 μm to 11 μm. Further, the lens 113 is configured to be movable up and down by an elevating mechanism (not shown).

Further, a transfer pad 120 as a transfer unit is provided above the chuck 100. The transfer pad 120 is configured to be movable up and down by an elevating mechanism (not shown). Furthermore, the transfer pad 120 has an adsorption surface for the second wafer W2. The transfer pad 120 transfers the second wafer W2 between the chuck 100 and the transfer arm 23. Specifically, after the chuck 100 is moved to a lower side of the transfer pad 120 (delivery position with the transfer arm 23), the transfer pad 120 attracts and holds the rear surface W2b of the second wafer W2 to separate the second wafer W2 from first wafer W1. Subsequently, the separated second wafer W2 is transferred from the transfer pad 120 to the transfer arm 23 to be carried out of the laser radiation device 31. The transfer pad 120 may also be configured to invert front and rear surfaces of a wafer by an inverting mechanism (not shown).

In the laser radiation device 31 shown in FIG. 5, the transfer arm 23 accesses the transfer pad 120 from the positive X-axis direction side. However, the transfer arm 23 may access the transfer pad 120 from the negative Y-axis direction side by rotating the laser radiation device 31 shown in FIG. 5 90 degrees counterclockwise.

When the combined wafer T is carried into the laser radiation device 31, the combined wafer T is delivered from the transfer arm 23 to the elevating pin to be placed on the chuck 100 by lowering the elevating pin. Further, when the separated second wafer W2 is carried out of the laser radiation device 31, the combined wafer T placed on the chuck 100 is raised by the elevating pin to be delivered from the elevating pin to the transfer arm 23.

Hereinafter, the wafer processing performed in the wafer processing system 1 configured as described above will be described. In the present exemplary embodiment, the first wafer W1 and the second wafer W2 are bonded to each other in an external bonding device (not shown) of the wafer processing system 1 to form the combined wafer T in advance.

First, the cassette Ct accommodating therein a plurality of combined wafers T is placed on the cassette placing table 11 of the carry-in/out block 10.

Then, a combined wafer T in the cassette Ct is taken out by the wafer transfer device 22 and transferred to the laser radiation device 31. In the laser radiation device 31, the combined wafer T is transferred from the transfer arm 23 to the elevating pin to be attracted and held by the chuck 100. Subsequently, the movement mechanism 104 moves the chuck 100 to a processing position. This processing position is a position where the laser beam can be radiated from the laser radiation unit 110 to the combined wafer T (laser absorption layer P).

Figure 6:
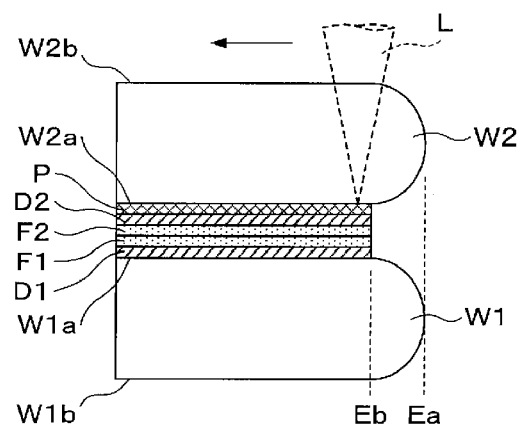
FIG. 6 is an explanatory diagram illustrating that the laser beam is radiated to a laser absorption layer according to the present exemplary embodiment.
Figure 7:
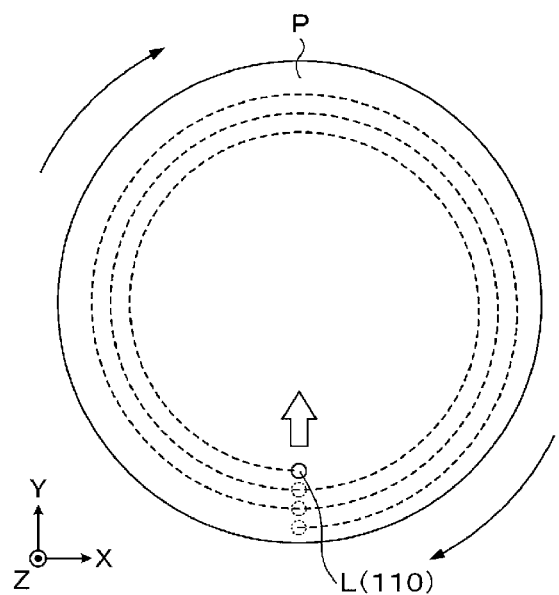
FIG. 7 is an explanatory diagram illustrating that the laser beam is radiated to the laser absorption layer according to the present exemplary embodiment.

Then, as shown in FIG. 6 and FIG. 7, a laser beam L ($CO_2$ laser beam) is radiated in a pulse shape from the laser radiation unit 110 to the laser absorption layer P, more specifically, an interface between the laser absorption layer P and the second wafer W2. Herein, the laser beam L is transmitted through the second wafer W2 from the rear surface W2b of the second wafer W2 to be absorbed by the laser absorption layer P. Thereafter, the laser beam L causes separation at the interface between the laser absorption layer P and the second wafer W2. Almost all of the laser beam L is absorbed by the laser absorption layer P and does not reach the device layer D2. Therefore, it is possible to suppress damage to the device layer D2.

When the laser absorption layer P is irradiated with the laser beam L, the rotation mechanism 103 rotates the chuck 100 (combined wafer T) and the movement mechanism 104 moves the chuck 100 in the Y-axis direction. Then, the laser beam L is radiated to the laser absorption layer P from an outer side to an inner side thereof in a diametrical direction. As a result, the laser beam L is radiated in a spiral shape from the outer side to the inner side. Further, the black arrows shown in FIG. 7 indicate a rotation direction of the chuck 100.

A radiation start position of the laser beam L is preferably between an outer edge Ea of the second wafer W2 and a bonding edge Eb between the first wafer W1 and the second wafer W2 in the combined wafer T. In this case, for example, even if a center of the first wafer W1 is misaligned and eccentric with a center of the second wafer W2 in the combined wafer T, an eccentric amount is absorbed and the laser beam L can be appropriately radiated to the laser absorption layer P.

Figure 8:
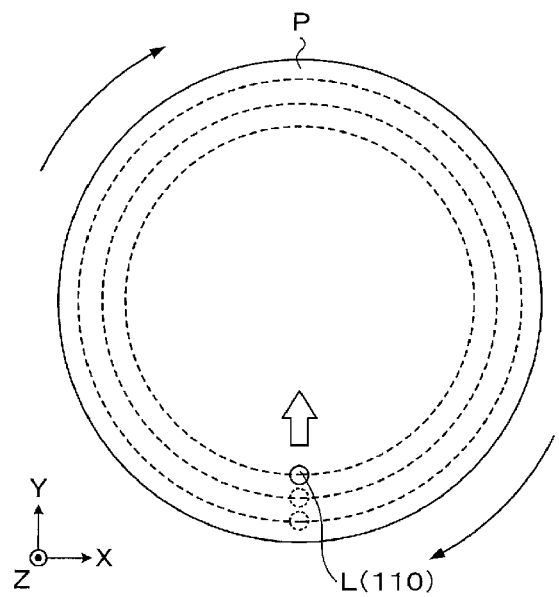
FIG. 8 is an explanatory diagram illustrating that a laser beam is radiated to a laser absorption layer according to a modification example of the present exemplary embodiment.

As shown in FIG. 8, the laser beam L may be annularly radiated in a concentric circular shape to the laser absorption layer P. However, in this case, since the rotation of the chuck 100 and the movement of the chuck 100 in the Y-axis direction are alternately performed, it is preferable to radiate the laser beam L in the spiral shape as described above so as to shorten the radiation time and improve the throughput.

Further, the laser beam L may be radiated to the laser absorption layer P from the inner side to the outer side in the diametrical direction. However, in this case, since the inner side of the laser absorption layer P is separated first, a stress caused by the separation may be directed to the outer side in the diametrical direction, and a portion on the outer side without being irradiated with the laser beam L may also be separated. Meanwhile, if the laser beam L is radiated from the outer side to the inner side in the diametrical direction as described above, the stress caused by the separation can be released to the outside. Therefore, it is possible to control the separation more easily. Further, by appropriately controlling the separation, it is possible to suppress the roughness of the separation surface.

Further, in the present exemplary embodiment, the chuck 100 is rotated while the laser beam L is radiated to the laser absorption layer P. Alternatively, the lens 113 may be moved to be rotated relative to the chuck 100. Further, although the chuck 100 is moved in the Y-axis direction, the lens 113 may be moved in the Y-axis direction.

In this way, the laser radiation device 31 radiates the laser beam L to the laser absorption layer P. Since the laser beam L is radiated in the pulsed shape, the peak power of the laser beam L can be increased. Therefore, as described above with reference to FIG. 1, the separation can occur at the interface between the laser absorption layer P and the second wafer W2. Thus, the second wafer W2 can be appropriately separated from the laser absorption layer P.

Figure 9A:
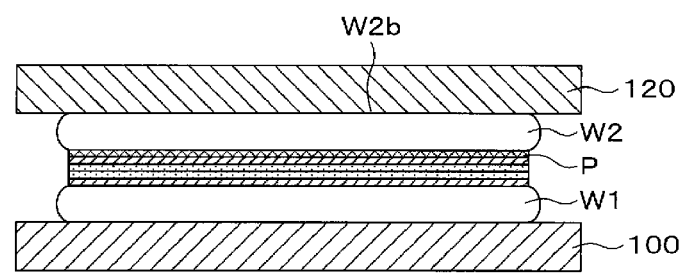
FIG. 9A and FIG. 9B are explanatory diagrams illustrating that a second wafer is separated from the laser absorption layer.
Figure 9B:
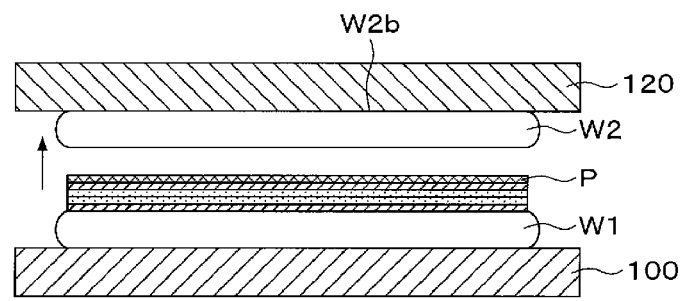

Then, the chuck 100 is moved to the delivery position by the movement mechanism 104. Thereafter, as shown in FIG. 9A, the transfer pad 120 attracts and holds the rear surface W2b of the second wafer W2. Then, as shown in FIG. 9B, in a state where the transfer pad 120 attracts and holds the second wafer W2, the transfer pad 120 is raised to separate the second wafer W2 from the laser absorption layer P. In this case, as described above, the separation occurs at the interface between the laser absorption layer P and the second wafer W2 due to the radiation of the laser beam L. Thus, the second wafer W2 can be separated from the laser absorption layer P without applying a large load.

The separated second wafer W2 is delivered from the transfer pad 120 to the transfer arm 23 of the wafer transfer device 22 and transferred to the cassette Cw2 on the cassette placing table 11. Also, the second wafer W2 carried out of the laser radiation device 31 may be transferred to the cleaning device 32 before being transferred to the cassette Cw2, and the front surface W2a, which is the separation surface, of the second wafer W2 may be cleaned. In this case, the transfer pad 120 may invert the front and rear surfaces of the second wafer W2 and then transfer the second wafer W2 to the transfer arm 23.

The first wafer W1 held by the chuck 100 is raised from the chuck 100 by the elevating pin, delivered to the transfer arm 23 and transferred to the cleaning device 32. In the cleaning device 32, a front surface, which is the separation surface, of the laser absorption layer P is scrub-cleaned. Also, in the cleaning device 32, the rear surface W1b of the first wafer W1 may be cleaned together with the front surface of the laser absorption layer P. Further, the cleaning device 32 may be provided with separate cleaning units configured to respectively clean the front surface of the laser absorption layer P and the rear surface W1b of the first wafer W1.

Thereafter, the first wafer W1, which has been subjected to all the processings, is transferred to the cassette Cw1 on the cassette placing table 11 by the wafer transfer device 22. In this way, a series of processes of the wafer processing in the wafer processing system 1 are completed.

According to the above-described exemplary embodiment, in the laser radiation device 31, the laser beam L is radiated in the pulse shape to the laser absorption layer P. Thus, the peak power of the laser beam L can be increased. As a result, the separation can occur at the interface between the laser absorption layer P and the second wafer W2. Further, when the laser beam L is radiated in the pulse shape, the laser lift-off can be stably performed due to the smaller thermal influence than when the continuous wave is used.

Therefore, the second wafer W2 can be appropriately separated from the laser absorption layer P and the device layer D2 can be transcribed to the first wafer W1.

Herein, an interval of radiating the laser beam L, i.e., a pulse interval, is preferably set to be uniform to achieve uniform separation between the first wafer W1 and the second wafer W2 in the surface of the wafer. However, if the chuck 100 (combined wafer T) is rotated, a rotation speed of the chuck 100 increases as the laser beam L moves from the outer side to the inner side in the diametrical direction to make the pulse interval uniform. In this case, when the rotation speed of the chuck 100 reaches an upper limit, an interval between the laser beams L may decrease as the radiation position of the laser beam L moves to the inner side in the diametrical direction. Thus, the laser beams L may overlap with each other at a central portion. Therefore, the interval of radiating the laser beam L needs to be adjusted. For example, there are two methods as follows.

The first method is to control the rotation speed of the chuck 100. That is, when the radiation position of the laser beam L is on the outer side in the diametrical direction of the laser absorption layer P, the rotation speed is decreased, and when the radiation position of the laser beam L is on the inner side, the rotation speed is increased. The adjustment of the rotation speed is performed depending on the frequency of the laser beam L. In this case, the interval of radiating the laser beam L can be made uniform by rotating the chuck 100 at a constant rotation speed.

The second method is to control the frequency of the laser beam L. That is, when the radiation position of the laser beam L is on the outer side in the diametrical direction of the laser absorption layer P, the frequency is increased, and when the radiation position of the laser beam L is on the inner side, the frequency is decreased. The adjustment of the frequency is performed depending on the rotation speed of the chuck 100. Even in this case, the interval of radiating the laser beam L can be made uniform by rotating the chuck 100 at a constant rotation speed.

Also, in order to shorten the processing time (tact) of the laser radiation and improve the throughput, it is preferable to maintain the rotation speed of the chuck 100 by using the laser beam L having a high frequency in the first method.

Alternatively, the first method and the second method may be performed together. In this case, the frequency of the laser beam L is increased while decreasing the rotation speed of the chuck 100 on the outer side in the diametrical direction. Meanwhile, the frequency of the laser beam L is decreased while increasing the rotation speed of the chuck 100 on the inner side in the diametrical direction.

Here, when controlling the frequency of the laser beam L in the second method, for example, when controlling the frequency of the laser beam L in a laser oscillator of the laser head 111, it is necessary to adjust parameters in consideration of the output or the pulse waveform of the laser beam L. For example, if the energy of the laser beam L required for the separation on the outer side in the diametrical direction of the laser absorption layer P is identical to the energy of the laser beam L required for the separation on the inner side in the diametrical direction of the laser absorption layer P, it is necessary to increase the output when increasing the frequency of the laser beam L on the outer side and decrease the output when decreasing the frequency of the laser beam L on the inner side. Further, when the frequency of the laser beam L is changed in the laser oscillator, the pulse waveform of the laser beam L is also changed, which requires a complicated adjustment in consideration of the output or the pulse waveform of the laser beam L. Therefore, it is difficult to control the process of laser processing.

Therefore, in the present exemplary embodiment, the frequency of the laser beam L is controlled by using an acousto-optic modulator as an optical element. As described above, the laser radiation unit 110 includes the laser head 111, the optical system 112 and the lens 113.

Figure 10:
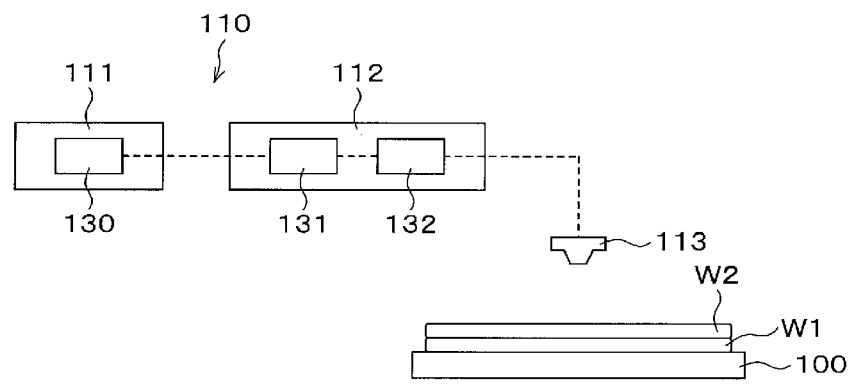
FIG. 10 is an explanatory diagram schematically illustrating a configuration of a laser radiation unit according to another exemplary embodiment.

As shown in FIG. 10, the laser head 111 has a laser oscillator 130 configured to oscillate the laser beam in the pulse shape. The frequency of the laser beam oscillated from the laser oscillator 130 is the highest frequency that can be allowed to be controlled by an acousto-optic modulator (AOM) 131 to be described later. Also, the laser head 111 may have other devices, for example, an amplifier, in addition to the laser oscillator 130.

The optical system 112 includes the acousto-optic modulator (AOM) 131 configured to divert the laser beam from the laser oscillator 130 in a different direction and an attenuator 132 configured to attenuate the laser beam from the laser oscillator 130 and adjust the output of the laser beam. The AOM 131 and the attenuator 132 are provided in this order from the laser oscillator 130.

Figure 11:
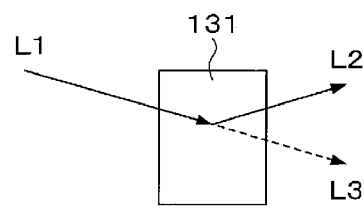
FIG. 11 is an explanatory diagram illustrating that a frequency of a laser beam is changed by an acousto-optic modulator according to another exemplary embodiment.

The AOM 131 is an optical modulator configured to electrically control the intensity and the position of the laser beam at a high speed. As shown in FIG. 11, when a laser beam L1 from the laser oscillator 130 is incident, the AOM 131 applies a voltage to change the refractive index of the laser beam L1 and thus diverts the laser beam L1 in a different direction. Specifically, a changed angle of the laser beam L1 can be controlled by adjusting the voltage. In the present exemplary embodiment, for example, the laser beam L1 is diverted in two different directions, and a laser beam L2 in one direction is radiated to the laser absorption layer P and a laser beam L3 in the other direction is not radiated to the laser absorption layer P. By controlling the diversion of the laser beams L2 and L3, it is possible to adjust the frequency of the laser beam L2 radiated to the laser absorption layer P.

Figure 12A:
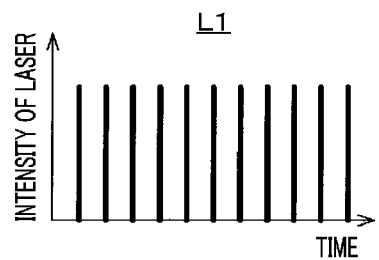
FIG. 12A and FIG. 12B are explanatory diagrams illustrating that the frequency of the laser beam is changed by the acousto-optic modulator according to another exemplary embodiment.
Figure 12B:
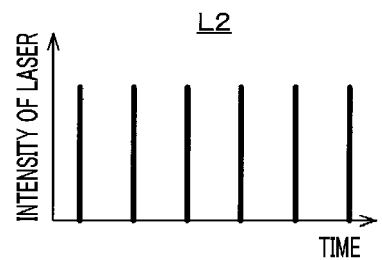

In this case, the frequency of the laser beam L2 radiated to the laser absorption layer P can be adjusted by thinning out the pulse of the laser beam L1 with the AOM 131. For example, if a diversion ratio of the laser beam L2 and the laser beam L3 to the laser beam L1 is set to 100:0 at a certain timing, the laser beam L1 becomes the laser beam L2 as it is and is radiated to the laser absorption layer P. If the diversion ratio of the laser beam L2 and the laser beam L3 to the laser beam L1 is set to 0:100 at another timing, the laser beam L2 has a value of 0 (zero) and the laser beam L2 is not radiated to the laser absorption layer P. In this case, the frequency of the laser beam L2 diverted by the AOM 131 shown in FIG. 12B can be adjusted with respect to the frequency of the laser beam L1 from the laser oscillator 130 shown in FIG. 12A. Further, as described above, since the frequency of the laser beam L1 is the highest frequency that can be allowed to be controlled by the AOM 131, the frequency of the laser beam L2 can be adjusted as required. The horizontal axis of FIG. 12A and FIG. 12B shows time, and the vertical axis shows the intensity of the laser beam L2. That is, the density of the graph in FIG. 12A and FIG. 12B indicates the frequency of the laser beam L2.

Moreover, in this case, since the frequency of the laser beam L1 oscillated from the laser oscillator 130 is not changed, the pulse waveform of the laser beam L1 is not changed. Thus, the pulse waveform of the laser beam L2 can be made identical to the pulse waveform of the laser beam L1. Therefore, it is possible to easily adjust the frequency of the laser beam L2 and it is not necessary to perform the conventional complicated adjustment as described above. Accordingly, it becomes easy to control the process of laser processing.

In the present exemplary embodiment, the AOM 131 is used as the optical element, but the present disclosure is not limited thereto. For example, an electro-optical modulator (EOM) may be used as the optical element. Further, an optical deflector such as an acousto-optic deflector (AOD) or an electro-optical deflector (EOD) may be used.

Hereinafter, a method of controlling the laser beam L2 when the laser radiation unit 110 radiates the laser beam L2 to the laser absorption layer P will be described. As described above, when a radiation position of the laser beam L2 is on the outer side in the diametrical direction of the laser absorption layer P, the frequency is increased, and when the radiation position of the laser beam L2 is on the inner side, the frequency is decreased.

Hereinafter, a specific example will be described. A numerical value in this specific example is an example, and the present disclosure is not limited thereto numerical value. For example, the energy required for the separation on each of the outer side and inner side in the diametrical direction of the laser absorption layer P is set to 400 µJ. A required frequency of the laser beam L2 on the outer side in the diametrical direction of the laser absorption layer P is set to 100 kHz, and a required frequency of the laser beam on the inner side is set to 50 kHz. The frequency of the laser beam L1 from the laser oscillator 130 is set to 100 kHz and the output thereof is set to 40 W.

In this case, the pulse of the laser beam L1 from the laser oscillator 130 is not thinned out by the AOM 131 on the outer side in the diametrical direction of the laser absorption layer P. Then, the frequency of the laser beam L2 radiated to the laser absorption layer P becomes 100 kHz, which is identical to the frequency of the laser beam L1. Further, the output of the laser beam L2 becomes 40 W, which is identical to the output of the laser beam L1. Also, the energy of the laser beam L2 becomes 400 µJ (=40 W/100 kHz). Thus, the separation can be appropriately performed.

Meanwhile, the pulse of the laser beam L1 from the laser oscillator 130 is thinned out to half by the AOM 131 on the inner side in the diametrical direction of the laser absorption layer P. Then, the frequency of the laser beam L2 radiated to the laser absorption layer P becomes 50 kHz, which is half the frequency of the laser beam L1. Further, by thinning out the laser beam L1, the output of the laser beam L2 becomes 20 W, which is half the output of the laser beam L1. Also, the energy of the laser beam L2 becomes 400 µJ (=20 W/50 kHz). Thus, the separation can be appropriately performed.

As described above, the rotation speed of the chuck 100 is controlled to make the pulse interval uniform depending on the frequency and the radiation position of the laser beam L2. Then, at the central portion of the laser absorption layer P, the maximum rotation speed of the chuck 100 is maintained and the AOM 131 adjusts the frequency of the laser beam L2 based on the maximum rotation speed. Accordingly, the laser processing can be performed while the high rotation speed of the chuck 100 and the high frequency of the laser beam L2 are maintained. Thus, the laser processing can be implemented with the high throughput.

Moreover, in this case, since the frequency of the laser beam L1 from the laser oscillator 130 is not changed, the pulse waveform of the laser beam L1 is not changed. Thus, the pulse waveform of the laser beam L2 can be made identical to the pulse waveform of the laser beam L1. Therefore, the frequency of the laser beam L2 can be easily adjusted, which makes it possible to perform a continuous seamless process. As a result, it becomes easy to control the process of laser processing and it is possible to implement a stable process.

In the present exemplary embodiment, since the output of the laser beam L1 from the laser oscillator 130 is 40 W, it is not necessary to adjust the output with respect to the energy of 400 µJ required for the separation. In this respect, for example, when the output of the laser beam L1 is 50 W, the attenuator 132 may attenuate the output of the laser beam L1 by 20% to adjust the output.

Figure 13:
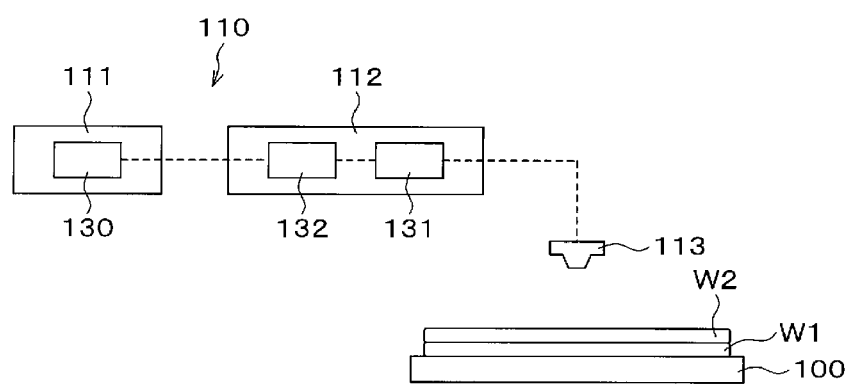
FIG. 13 is an explanatory diagram schematically illustrating a configuration of the laser radiation unit according to another exemplary embodiment.
Figure 14:
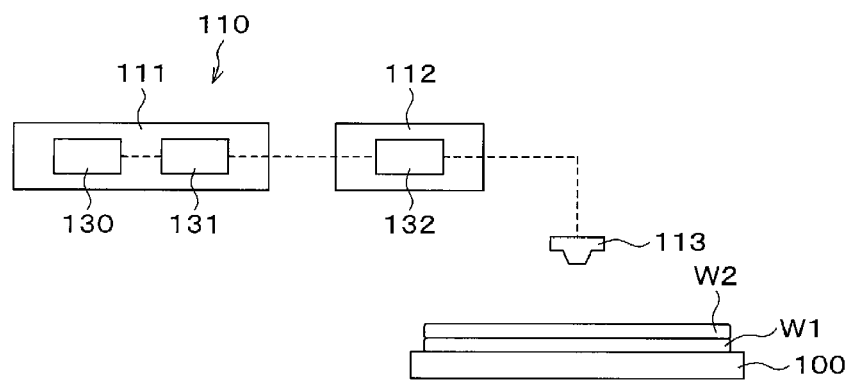
FIG. 14 is an explanatory diagram schematically illustrating a configuration of the laser radiation unit according to another exemplary embodiment.

In the laser radiation unit 110 according to the above-described exemplary embodiment, the AOM 131 is provided on an upstream side of the attenuator 132 inside the optical system 112, but the installation position is not limited thereto. For example, as shown in FIG. 13, the AOM 131 may be provided on a downstream side of the attenuator 132 inside the optical system 112. Alternatively, for example, as shown in FIG. 14, the AOM 131 may be provided on a downstream side of the laser oscillator 130 inside the laser head 111. Further, the AOM 131 may be provided at two or more of the above-described installation positions.

In the laser radiation unit 110, after the AOM 131 adjusts the frequency and output of the laser beam L2, the attenuator 132 can finely adjust the output. Herein, the output of the laser beam L1 oscillated from the laser oscillator 130 may become non-uniform depending on the individual difference of the laser oscillator 130. The attenuator 132 can correct the non-uniformity in output. Further, when the output of the laser beam L1 from the laser oscillator 130 is monitored over time, the attenuator 132 can be feedback-controlled to adjust the output. Also, from the viewpoint of finely adjusting the output of the laser beam L2 by the attenuator 132, the AOM 131 is preferably provided on the upstream side of the attenuator 132 as shown in FIG. 10.

The attenuator 132 may be omitted from the laser radiation unit 110 according to the above-described exemplary embodiment. For example, the output of the laser beam L2 may be adjusted by the AOM 131 instead of the attenuator 132. For example, if the output of the laser beam L1 is 50 W and the output of the laser beam L2 required for separation is 40 W, the AOM 131 may adjust the diversion ratio of the laser beam L2 and the laser beam L3 to the laser beam L1 to 80:20 to set the output of the laser beam L2 to 40 W.

In the above-described exemplary embodiment, the laser absorption layer P is irradiated with the laser beam L in the spiral shape or the concentric circular shape, but the radiation pattern of the laser beam L is not limited thereto. Further, the configuration of the device corresponding to such various radiation patterns is not limited to the laser radiation device 31 of the above-described exemplary embodiment. In the laser radiation device 31, the chuck 100 is rotatable around the θ axis and movable in the uniaxial (Y-axis) direction, but may be moved in biaxial (X-axis and Y-axis) directions.

Figure 15:
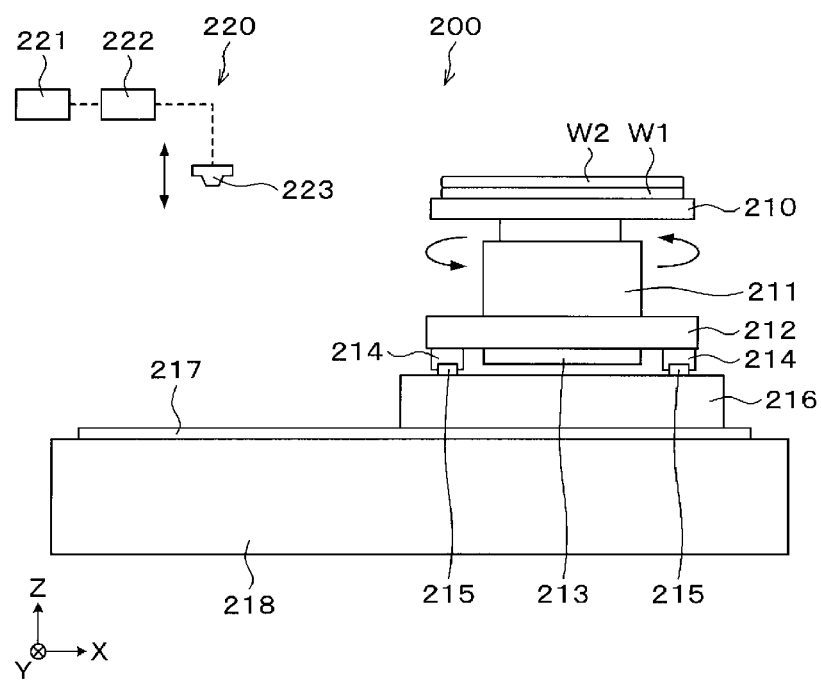
FIG. 15 is a side view schematically illustrating a configuration of a laser radiation device according to another exemplary embodiment.
Figure 16:
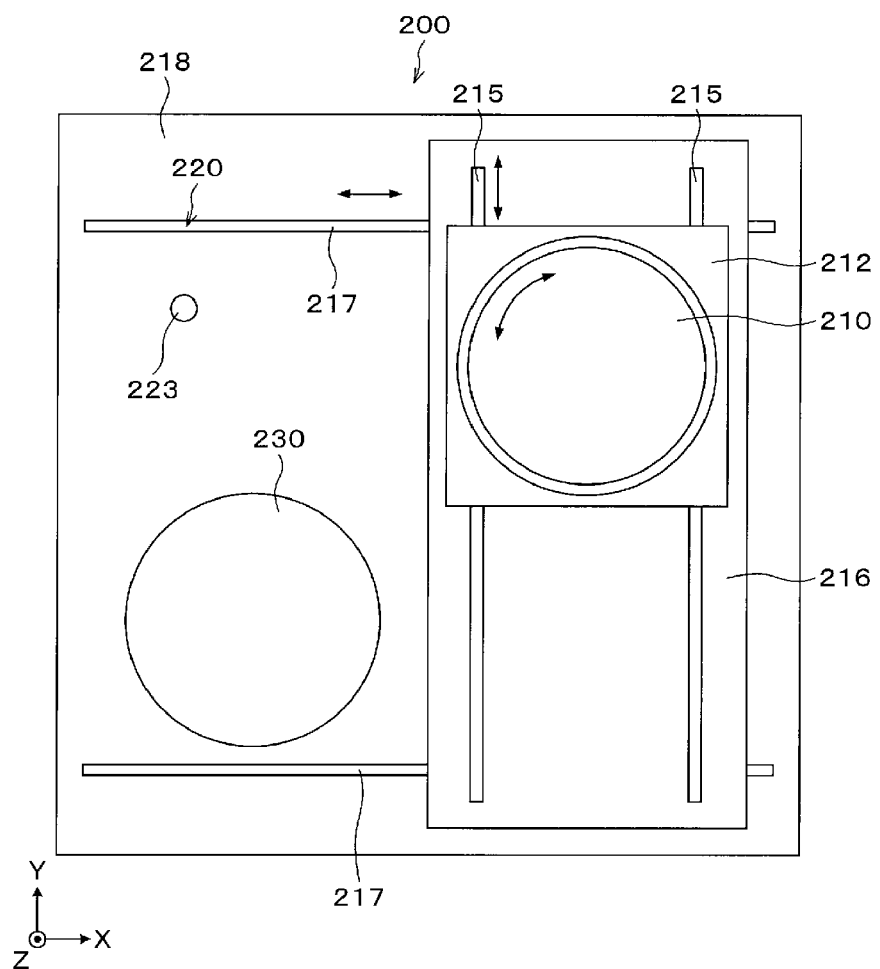
FIG. 16 is a plan view schematically illustrating the configuration of the laser radiation device according to another exemplary embodiment.

A laser radiation device 200 shown in FIG. 15 and FIG. 16 is a device configured to move the chuck 100 in biaxial (X-axis and Y-axis) directions. The laser radiation device 200 includes a chuck 210 as a holder configured to hold the combined wafer T on an upper surface thereof. The chuck 210 is configured to attract and hold the entire rear surface W1b of the first wafer W1. The chuck 210 is provided with an elevating pin (not shown) configured to support and elevate the combined wafer T from below. The elevating pin is inserted into a through-hole (not shown) formed through the chuck 210, and is configured to be movable up and down.

The chuck 210 is supported on a slider table 212 via an air bearing 211 therebetween. A rotation mechanism 213 is provided at a bottom surface of the slider table 212. The rotation mechanism 213 incorporates therein, for example, a motor as a driving source. The chuck 210 is configured to be rotatable around the θ axis (vertical axis) by the rotation mechanism 213 via the air bearing 211 therebetween. The slider table 212 is configured to be movable by a movement mechanism 214, which is provided at the bottom surface thereof, along a rail 215 which is provided on a movement stage 216 and elongated in the Y-axis direction. Further, although not particularly limited, a driving source of the movement mechanism 214 may be, for example, a linear motor.

The movement stage 216 is configured to be movable by a movement mechanism (not shown), which is provided at the bottom surface thereof, along a rail 217 which is provided on a base 218 and elongated in the X-axis direction. Further, although not particularly limited, a driving source of the movement mechanism may be, for example, a linear motor. With this configuration, the chuck 210 is rotatable around the θ axis and movable in the X-axis and Y-axis directions.

A laser radiation unit 220 is provided above the chuck 210. The laser radiation unit 220 includes a laser head 221, an optical system 222 and a lens 223. The laser head 221 is configured to oscillate a laser beam L in a pulse shape. The optical system 222 controls intensity and a position of the laser beam L, or adjusts the output by attenuating the laser beam L. The lens 223 is a cylindrical member and is configured to radiate the laser beam L, e.g., a $CO_2$ laser beam, to the combined wafer T held by the chuck 210. Further, the lens 223 is configured to be movable up and down by an elevating mechanism (not shown).

For example, galvano is used for the laser head 221. A plurality of galvano mirrors (not shown) is arranged inside the laser head 221. Further, an f-θ lens is used for the lens 223. With this configuration, the laser beam L input to the laser head 221 is reflected by the galvano mirrors, propagated to the lens 223 via the optical system 222, transmitted through the second wafer W2 and radiated to the laser absorption layer P. Furthermore, the laser absorption layer P may be scanned with the laser beam L by adjusting the angle of the galvano mirrors.

Also, a transfer pad 230 as a transfer unit is provided above the chuck 210. The transfer pad 230 is configured to be movable up and down by an elevating mechanism (not shown). The transfer pad 230 has the same configuration as the transfer pad 120 of the above-described exemplary embodiment.

In the laser radiation device 200, the combined wafer T is delivered from the transfer arm 23 to the elevating pin to be attracted and held by the chuck 210. Subsequently, the movement mechanism 214 and the movement stage 216 move the chuck 210 to a processing position. This processing position is a position where the laser beam L can be radiated from the laser radiation unit 220 to the combined wafer T (laser absorption layer P).

Figure 17:
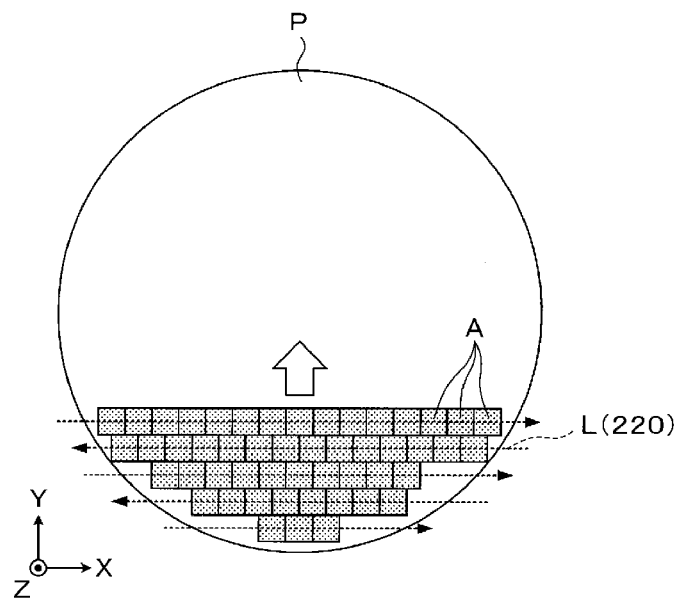
FIG. 17 is an explanatory diagram illustrating that a laser beam is radiated to a laser absorption layer according to another exemplary embodiment.

Then, as shown in FIG. 17, the laser beam L is radiated in a pulse shape from the laser radiation unit 220 to the laser absorption layer P. Herein, the laser beam L is transmitted through the second wafer W2 from the rear surface W2b of the second wafer W2 to be absorbed by the laser absorption layer P.

When the laser absorption layer P is irradiated with the laser beam L, a predetermined scanning range A (square region in FIG. 17) is scanned with the laser beam L. Then, the chuck 210 is moved in the X-axis direction in a state where the radiation of the laser beam L is stopped. In this way, the laser beam L is radiated in a row in the X-axis direction by repeatedly performing the radiation and the scanning of the laser beam L and the movement of the chuck 210. Thereafter, the chuck 210 is moved in the Y-axis direction, and then, the laser beam L is radiated in a row in the X-axis direction by repeatedly performing the radiation and the scanning of the laser beam L and the movement of the chuck 210 as described above. As a result, the laser beam L is radiated to the laser absorption layer P.

In the present exemplary embodiment, when the laser absorption layer P is irradiated with the laser beam L, the chuck 210 is moved in the X-axis direction and the Y-axis direction, but the lens 223 may be moved relative to the chuck 210.

Then, the chuck 210 is moved to the delivery position by the movement mechanism 214 and the movement stage 216. Thereafter, the transfer pad 230 attracts and holds the rear surface W2b of the second wafer W2, and the transfer pad 230 is raised to separate the second wafer W2 from the laser absorption layer P.

In the present exemplary embodiment as well, the same effects as obtained in the above-described exemplary embodiment can be achieved. That is, since the laser beam L is radiated in the pulse shape to the laser absorption layer P, the peak power of the laser beam L can be increased. As a result, the separation can occur at the interface between the laser absorption layer P and the second wafer W2. Moreover, since the scanning range A can be irradiated with the laser beam L of the same density, the laser beam L can be uniformly radiated to the laser absorption layer P.

In the present exemplary embodiment, there may be a plurality of laser radiation units 220. In this case, the laser absorption layer P can be irradiated with a plurality of laser beams L. Also, the processing time can be shortened and the throughput can be further improved.

Figure 18:
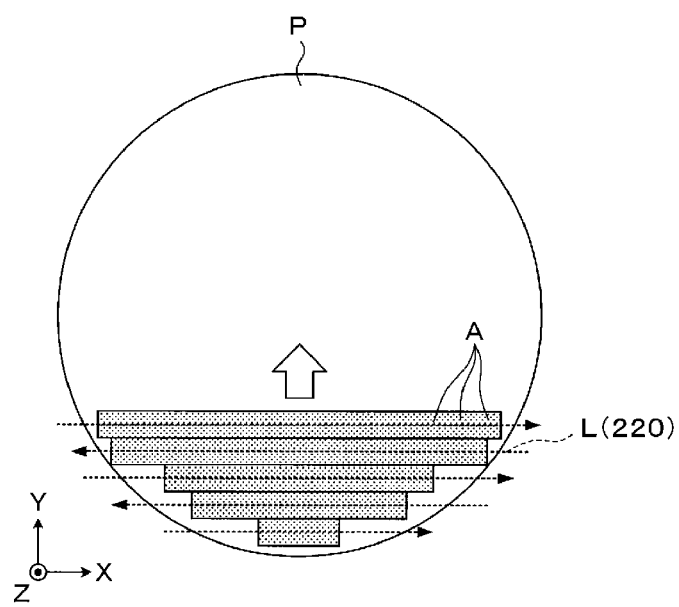
FIG. 18 is an explanatory diagram illustrating that a laser beam is radiated to the laser absorption layer according to another exemplary embodiment.

In the above-described exemplary embodiment, the radiation and the scanning of the laser beam L and the movement of the chuck 210 are repeatedly performed. However, as shown in FIG. 18, the radiation and the scanning of the laser beam L may be performed in a row in the X-axis direction while moving the chuck 210. After the laser beam L is radiated in a row in the X-axis direction, the chuck 210 is moved in the Y-axis direction and the laser beam L is radiated to the laser absorption layer P.

In the present exemplary embodiment as well, the same effects as obtained in the above-described exemplary embodiment can be achieved. That is, since the laser beam L is radiated in the pulse shape to the laser absorption layer P, the separation can occur at the interface between the laser absorption layer P and the second wafer W2. Moreover, since the radiation and the scanning of the laser beam L in a row in the X-axis direction are not stopped, the processing time of laser radiation can be shortened and the throughput can be further improved.

The radiation of the laser beam L in the spiral shape (or concentric circular shape) according to the above-described exemplary embodiment may be combined with the radiation and the scanning of the laser beam L.

If the chuck 210 (combined wafer T) is rotated, the rotation speed of the chuck 210 increases as the laser beam L moves from the outer side to the inner side in the diametrical direction to make the pulse interval uniform as described above. Therefore, in the above-described exemplary embodiment, at least the rotation speed of the chuck 210 or the frequency is controlled to adjust the interval of radiating the laser beam L.

Figure 19:
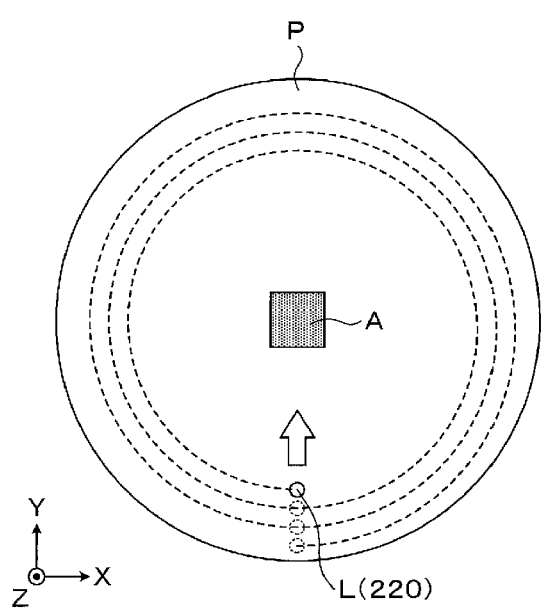
FIG. 19 is an explanatory diagram illustrating that a laser beam is radiated to the laser absorption layer according to another exemplary embodiment.

In this regard, as shown in FIG. 19, on an outer peripheral portion of the laser absorption layer P, the laser beam L is radiated in a spiral shape by moving the chuck 210 to move the radiation position of the laser beam L from the outer side to the inner side in the diametrical direction while rotating the chuck 210. When the rotation speed of the chuck 210 reaches an upper limit, rotation of the chuck 210 is stopped at the central portion of the laser absorption layer P and the scanning range A is scanned while radiating the laser beam L. Although the scanning range A is illustrated as having a square shape, the shape of the scanning range A is not limited thereto. For example, the scanning range A may have a round shape.

As described above, since the radiation pattern of the laser beam L is changed between the outer peripheral portion and the central portion of the laser absorption layer P, the laser beams L may not overlap with each other and the interval of radiating the laser beam L, i.e., the pulse interval, may be made uniform. As a result, it is possible to achieve the uniform separation between the first wafer W1 and the second wafer W2 in the surface of the wafer.

When the radiation range of the laser beam L from the laser radiation unit 220 is wide, for example, when the radiation range is equal to or greater than the diameter of the laser absorption layer P, the laser beam L may be radiated to the entire surface of the laser absorption layer P at a time.

Figure 20:
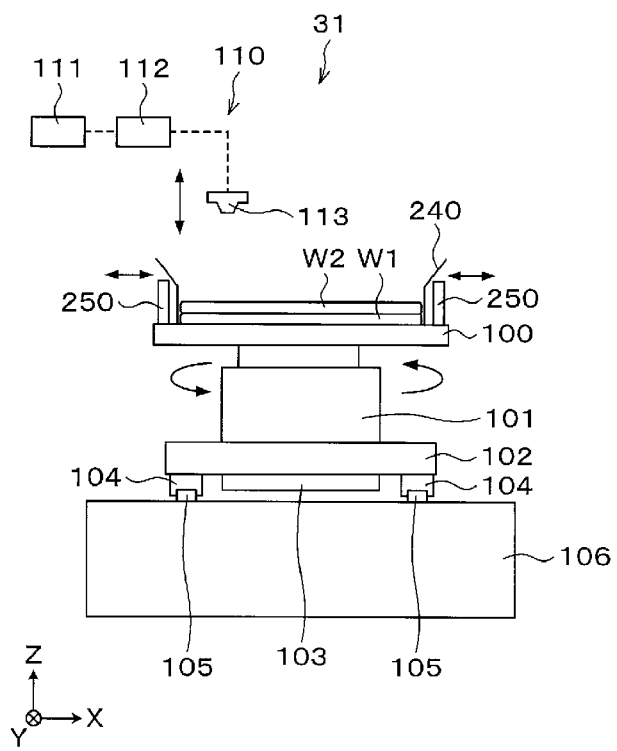
FIG. 20 is a side view schematically illustrating a configuration of a laser radiation device according to another exemplary embodiment.

In the laser radiation device 31 of the above-described exemplary embodiment, as shown in FIG. 20, a guide unit 240 and a holding member 250 may be provided on an upper surface of the chuck 100.

Figure 21:
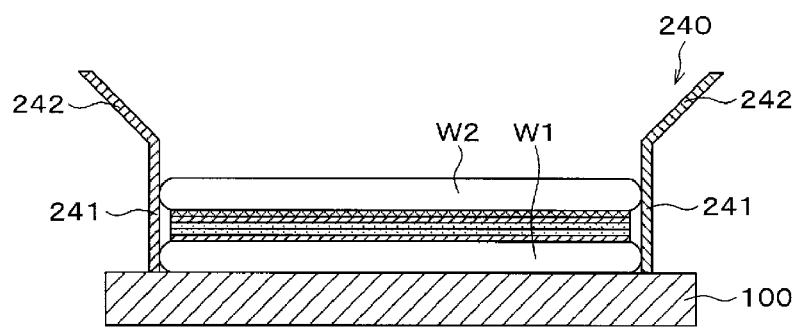
FIG. 21 is a side view schematically illustrating a configuration of a guide unit.

As shown in FIG. 21, the guide unit 240 is configured to guide the combined wafer T to the chuck 100. The guide unit 240 has a vertical portion 241 extending vertically upwards from the chuck 100 and an inclined portion 242 provided so as to increase the diameter thereof upwards from the vertical portion 241. An inner diameter of the vertical portion 241 is slightly greater than the diameter of the combined wafer T. The combined wafer T placed above the chuck 100 is centered by the inclined portion 242 and guided by the vertical portion 241 and then held by the chuck 100.

Figure 22:
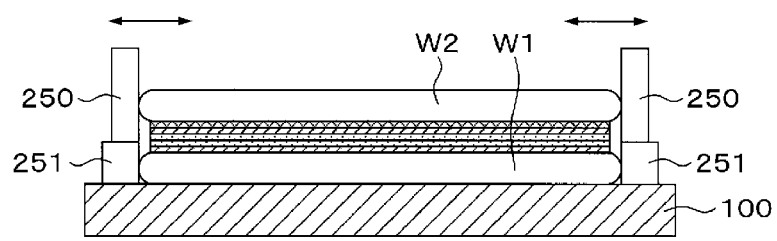
FIG. 22 is a side view schematically illustrating a configuration of a holding member.
Figure 23:
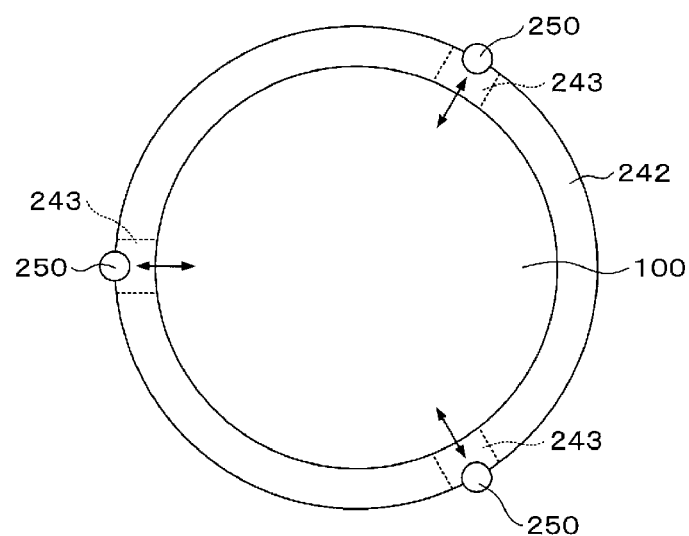
FIG. 23 is a plan view schematically illustrating the configuration of the guide unit and the holding member.

As shown in FIG. 22 and FIG. 23, the holding member 250 extends vertically upwards from the upper surface of the chuck 100 and holds a side surface of the second wafer W2. The holding member 250 is arranged at each of a plurality of, for example, three locations on concentric circles of the chuck 100. The holding member 250 is configured to be movable forwards and backwards by a movement mechanism 251 so as to be in contact with or separated from the second wafer W2. Further, the holding member 250 is configured to be rotatable together with the chuck 100. Since the holding member 250 holds the second wafer W2, it is possible to suppress misalignment and slipping-down of the second wafer W2. In the guide unit 240, a notch 243 is formed at a position corresponding to the holding member 250. Further, the holding member 250 is moved through the notch 243 so as not to interfere with the guide unit 240.

Although both the guide unit 240 and the holding member 250 are provided in the present exemplary embodiment, only the guide unit 240 may be provided or only the holding member 250 may be provided. If only the guide unit 240 is provided, the vertical portion 241 can suppress the misalignment and the slipping-down of the second wafer W2. In particular, when a gap between the vertical portion 241 and the second wafer W2 is within an allowable range of the misalignment, the guide unit 240 becomes useful. However, when both the guide unit 240 and the holding member 250 are provided, it is more effective in centering the combined wafer T and suppressing the misalignment and the slipping-down of the second wafer W2.

In this case, when the combined wafer T is held by the chuck 100 at the delivery position, the three holding members 250 retreat to positions where they are not in contact with the second wafer W2. Then, after the chuck 100 holding the combined wafer T is moved to the processing position, the three holding members 250 are moved to positions where they are in contact with the side surface of the second wafer W2 to hold the second wafer W2.

When the guide unit 240 and the holding member 250 are not provided, if the laser beam L is radiated in the spiral shape from the outer side to the inner side in the diametrical direction of the laser absorption layer P, the separation may occur, and since the chuck 100 is rotated, a centrifugal force acts on the second wafer W2 so that the second wafer W2 is misaligned with the laser absorption layer P. Thus, the laser beam L may be radiated to a place other than the processing target position during the laser processing. Also, the separated second wafer W2 may slip down. In this respect, in the present exemplary embodiment, the holding member 250 holds the second wafer W2, and, thus, it is possible to suppress the misalignment or the slipping-down of the second wafer W2.

Even when the chuck 100 is moved to the delivery position after the radiation of the laser beam L, the holding member 250 holds the second wafer W2. Herein, while the chuck 100 is moved, an inertial force acts on the second wafer W2, and, thus, the second wafer W2 may be misaligned with the laser absorption layer P. In this case, when the rear surface W2b of the second wafer W2 is attracted and held subsequently by the transfer pad 120, the transfer pad 120 cannot attract and hold an appropriate position. Therefore, in the present exemplary embodiment, even while the chuck 100 is moved, the holding member 250 holds the second wafer W2 to suppress the misalignment of the second wafer W2.

A configuration of the holding member configured to hold the second wafer W2 is not limited to the configuration of the holding member 250. For example, the holding member may hold the second wafer W2 from a side portion of the second wafer W2 to sandwich the upper surface and the side surface of the second wafer W2. Further, the holding member may hold the second wafer W2 in the middle of the laser processing. Furthermore, if the holding member is made of a material, e.g., silicon, that transmits the laser beam L, the holding member may hold the upper surface of the second wafer W2.

The wafer processing system 1 of the above-described exemplary embodiment includes the cleaning device 32, but the wafer processing system 1 may further include an etching device (not shown). The etching device is configured to etch the front surface W1a of the first wafer W1, specifically, the front surface of the laser absorption layer P after the separation. For example, after the front surface of the laser absorption layer P is scrub-cleaned by the cleaning device 32, a chemical solution (etching solution) is supplied to the front surface of the laser absorption layer P to wet-etch the front surface. Further, the wafer processing system 1 may include either the cleaning device 32 or the etching device.

Further, the wafer processing system 1 of the above-described exemplary embodiment may include a CMP (chemical mechanical polishing) device (not shown). The CMP device is configured to perform a CMP processing to the front surface W1a of the first wafer W1, specifically, the front surface of the laser absorption layer P after the separation. For example, after the front surface of the laser absorption layer P is scrub-cleaned by the cleaning device 32, the CMP processing is performed on the front surface of the laser absorption layer P to flatten the front surface of the laser absorption layer P. The CMP device may be provided outside the wafer processing system 1.

In the above-described exemplary embodiment, the laser beam L is radiated to the interface between the laser absorption layer P and the second wafer W2 to separate the second wafer W2 from the laser absorption layer P. However, for example, as shown in FIG. 24A and FIG. 24B, the laser absorption layer P may be separated so as to remain on the second wafer W2.

Figure 24A:
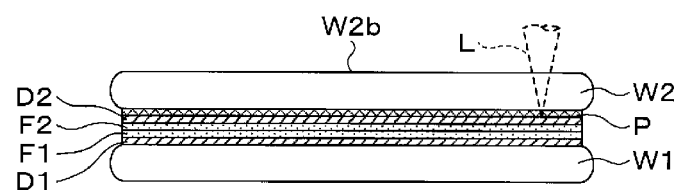
FIG. 24A and FIG. 24B are explanatory diagrams illustrating that a device layer formed on a surface of a second wafer is transcribed to a first wafer according to another exemplary embodiment.

In this case, in the laser radiation device 31, the laser beam L is radiated the a pulse shape from the laser radiation unit 110 to the interface between the laser absorption layer P and the device layer D2 as shown in FIG. 24A. Then, the laser beam L causes the separation at the interface between the laser absorption layer P and the device layer D2.

The adjustment of the absorption position of the laser beam L, i.e., adjustment of the separation position of the laser absorption layer P, is performed by controlling an energy density of the laser beam L required for the separation of the laser absorption layer P depending on the film type of the laser absorption layer P. For example, the energy density of the laser beam L can be adjusted by adjusting a focus numerical aperture (NA) of the laser radiation unit 110, changing a focus position of the laser beam L, changing an original output of the laser beam L, and the like.

Figure 24B:
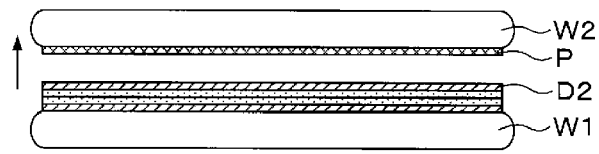

Then, in a state where the transfer pad 120 attracts and holds the rear surface W2b of the second wafer W2, the transfer pad 120 is raised as shown in FIG. 24B to separate the laser absorption layer P from the device layer D2.

In the present exemplary embodiment as well, the same effects as obtained in the above-described exemplary embodiment can be achieved. That is, since the laser beam L is radiated in the pulse shape to the laser absorption layer P, the peak power of the laser beam L can be increased. As a result, the separation can occur at the interface between the laser absorption layer P and the device layer D2. Moreover, the laser absorption layer P remaining on the second wafer W2 is an oxide film ($SiO_2$ film). For example, in a subsequent semiconductor manufacturing process, the remaining laser absorption layer P can be used as an oxide film (insulating film) when a TSV (Through-Silicon Via) is formed in the second wafer W2.

Further, in the present exemplary embodiment, the front surface of the laser absorption layer P on the second wafer W2 after the separation may be scrub-cleaned and may be further subjected to the CMP processing by the CMP device. In this case, the front surface of the laser absorption layer P can be flattened. Also, as described above, the laser absorption layer P can be appropriately used as the oxide film (insulating film) when the TSV is formed.

In the above-described exemplary embodiment, a case of processing the combined wafer T shown in FIG. 2 has been described, but the processing target is not limited thereto. Hereinafter, cases of processing different types of combined wafers T will be described with reference to FIG. 25A to FIG. 28D.

Figure 25A:
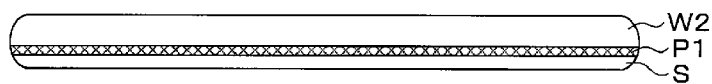
FIG. 25A to FIG. 25E are explanatory diagrams illustrating that the device layer formed on the surface of the second wafer is transferred to the first wafer according to another exemplary embodiment.

A case of processing the combined wafer T shown in FIG. 25A to FIG. 25E will be described. As shown in FIG. 25A, a laser absorption layer P1 formed between the second wafer W2 and the device layer D2 is formed inside the second wafer W2. The second wafer W2 is, for example, an SaI substrate and the laser absorption layer P1 is, for example, an oxide film ($SiO_2$ film). That is, Si, which is the second wafer W2, an $SiO_2$ film, which is the laser absorption layer P1, and Si, which is an Si film S, are sequentially stacked. As the laser absorption layer P1, a film other than the oxide film ($SiO_2$ film), e.g., silicon germanium (SiGe) or germanium (Ge), may be used as long as it is separated at the interface with the Si film S.

Figure 25B:
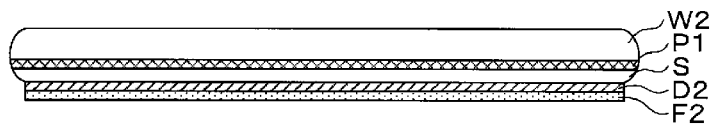

Then, as shown in FIG. 25B, the device layer D2 and a front surface film F2 are formed on a front surface of the laser absorption layer P1. The device layer D2 and the front surface film F2 are formed by a typical substrate process (FEOL) or interconnect process (BEOL).

Figure 25C:
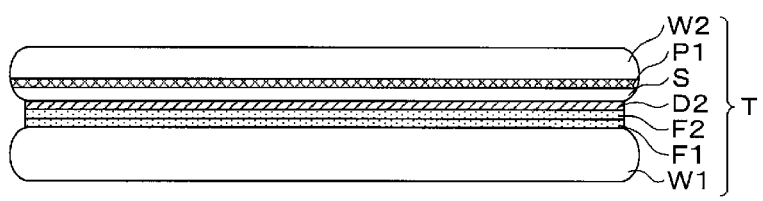

Thereafter, as shown in FIG. 25C, the first wafer W1 and the second wafer W2 are bonded to each other. The front surface film F1 formed on the front surface W1a of the first wafer W1 is bonded to the front surface film F2.

Figure 25D:
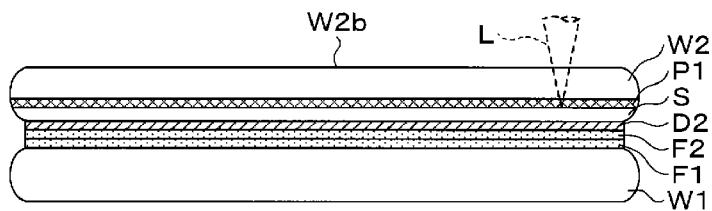

Then, in the laser radiation device 31 of the wafer processing system 1, the laser beam L is radiated in the pulse shape from the laser radiation unit 110 to the interface between the laser absorption layer P1 and the Si film S as shown in FIG. 25D. Thereafter, the laser beam L causes the separation at the interface between the laser absorption layer P1 and the Si film S.

Figure 25E:
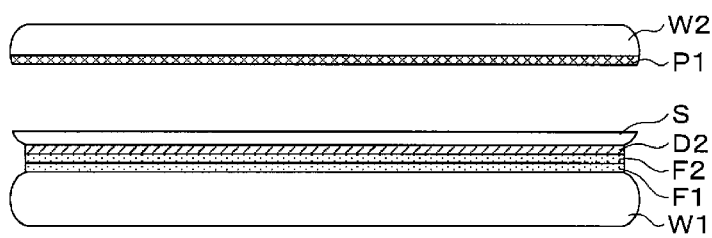

Subsequently, in a state where the transfer pad 120 attracts and holds the rear surface W2b of the second wafer W2, the transfer pad 120 is raised as shown in FIG. 25E to separate the laser absorption layer P1 from the Si film S.

In the present exemplary embodiment as well, the separation position of the laser absorption layer P1 may be adjusted by adjusting the absorption position of the laser beam L, the separation position of the laser absorption layer P1, as in the case shown in FIG. 24A and FIG. 24B, and the separation may occur at the interface between the second wafer W2 and the laser absorption layer P1.

Figure 26A:
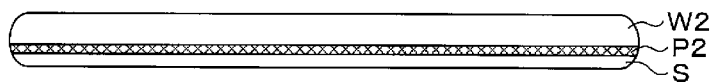
FIG. 26A to FIG. 26E are explanatory diagrams illustrating that the device layer formed on the surface of the second wafer is transferred to the first wafer according to another exemplary embodiment.
Figure 26B:
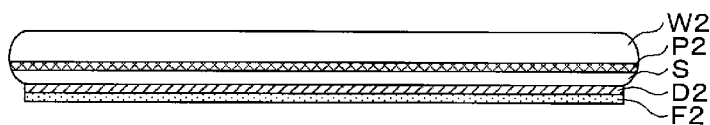

A case of processing the combined wafer T shown in FIG. 26A to FIG. 26E will be described. As shown in FIG. 26A and FIG. 26B, a laser absorption layer P2 made of silicon germanium (SiGe) and the Si film S made of Si are formed between the second wafer W2 and the device layer D2 to be stacked in this order from the second wafer W2.

Then, as shown in FIG. 26B, the device layer D2 and the front surface film F2 are formed on a front surface of the Si film S.

Figure 26C:
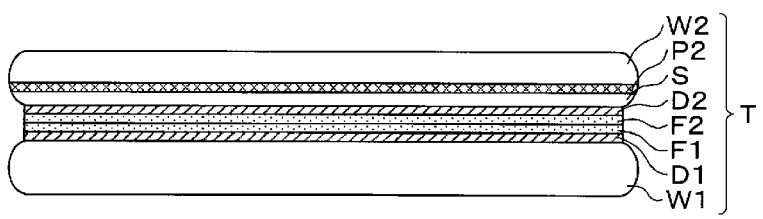

Thereafter, as shown in FIG. 26C, the first wafer W1 and the second wafer W2 are bonded to each other. The device layer D1 and the front surface film F1 are formed on the front surface W1a of the first wafer W1, and the front surface film F1 is bonded to the front surface film F2.

Figure 26D:
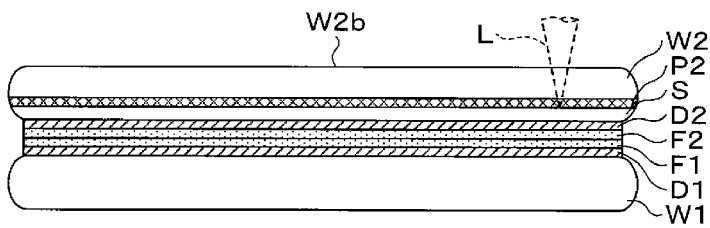

Then, in the laser radiation device 31 of the wafer processing system 1, the laser beam L is radiated in the pulse shape from the laser radiation unit 110 to the interface between the laser absorption layer P2 and the Si film S as shown in FIG. 26D. Thereafter, the laser beam L causes the separation at the interface between the laser absorption layer P2 and the Si film S.

Figure 26E:
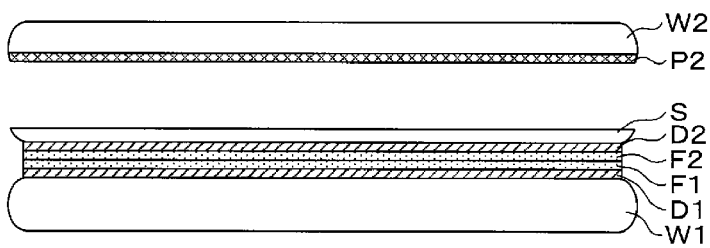

Subsequently, in a state where the transfer pad 120 attracts and holds the rear surface W2b of the second wafer W2, the transfer pad 120 is raised as shown in FIG. 26E to separate the laser absorption layer P2 from the Si film S. In the present exemplary embodiment as well, the separation position of the laser absorption layer P2 may be adjusted by adjusting the absorption position of the laser beam L, i.e., the separation position of the laser absorption layer P2, as in the case shown in FIG. 24A and FIG. 24B, and the separation may occur at the interface between the second wafer W2 and the laser absorption layer P2.

Figure 27A:
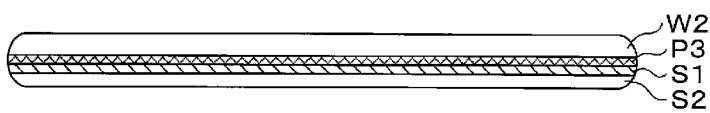
FIG. 27A to FIG. 27E are explanatory diagrams illustrating that the device layer formed on the surface of the second wafer is transferred to the first wafer according to another exemplary embodiment.
Figure 27B:
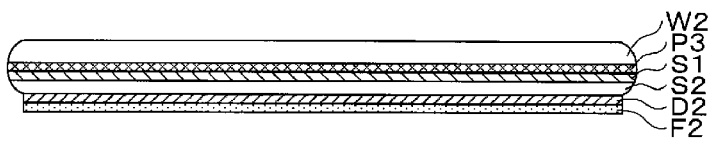

A case of processing the combined wafer T shown in FIG. 27A to FIG. 27E will be described. As shown in FIG. 27A and FIG. 27B, a laser absorption layer P3 made of an oxide film ($SiO_2$ film), an SiGe film S1 made of SiGe and an Si film S2 made of Si are formed between the second wafer W2 and the device layer D2 to be stacked in this order from the second wafer W2.

Then, as shown in FIG. 27B, the device layer D2 and the front surface film F2 are formed on a front surface of the Si film S2 made of Si.

Figure 27C:
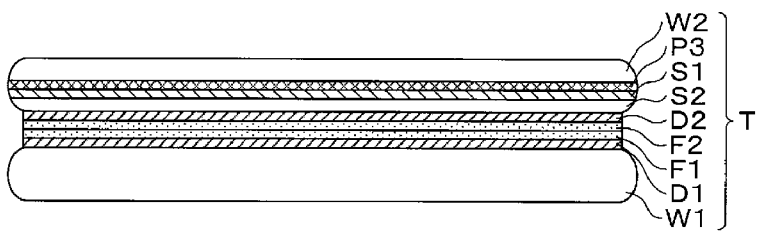

Thereafter, as shown in FIG. 27C, the first wafer W1 and the second wafer W2 are bonded to each other. The device layer D1 and the front surface film F1 are formed on the front surface W1a of the first wafer W1, and the front surface film F1 is bonded to the front surface film F2.

Figure 27D:
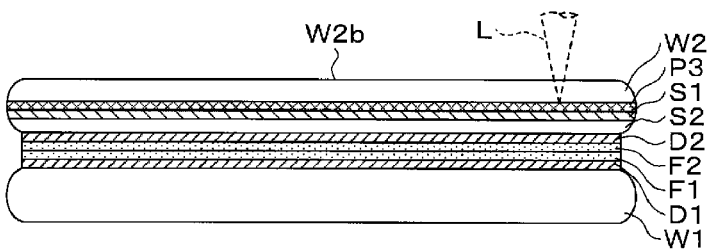

Then, in the laser radiation device 31 of the wafer processing system 1, the laser beam L is radiated in the pulse shape from the laser radiation unit 110 to the interface between the laser absorption layer P3 and the second wafer W2 as shown in FIG. 27D. Thereafter, the laser beam L causes the separation at the interface between the laser absorption layer P3 and the second wafer W2.

Figure 27E:
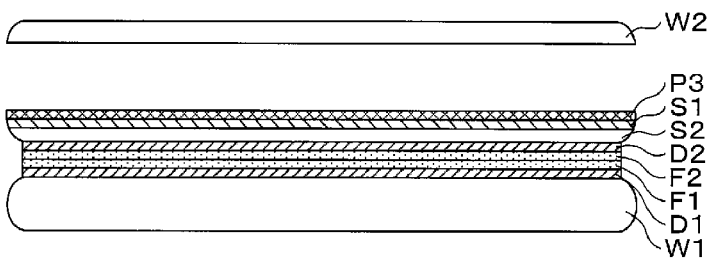

Subsequently, in a state where the transfer pad 120 attracts and holds the rear surface W2b of the second wafer W2, the transfer pad 120 is raised as shown in FIG. 27E to separate the second wafer W2 from the laser absorption layer P3.

Figure 28A:
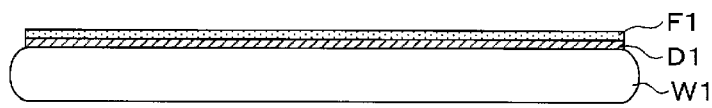
FIG. 28A to FIG. 28D are explanatory diagrams illustrating that the device layer formed on the surface of the second wafer is transferred to the first wafer according to another exemplary embodiment.

A case of processing the combined wafer T shown in FIG. 28A to FIG. 28D will be described. The combined wafer T has a structure in which a Ge-pMOS is stacked on an Si-nMOS. As shown in FIG. 28A, the device layer D1 and the front surface film F1 are formed on the front surface W1a of the first wafer W1. That is, the first wafer W1 is the Si-nMOS.

Figure 28B:
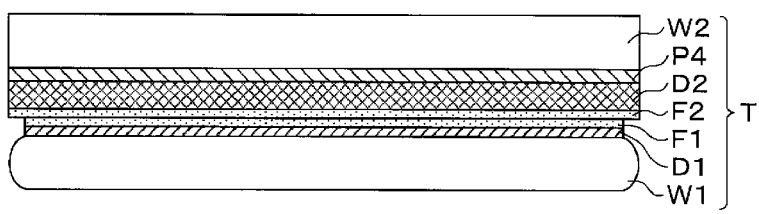

Then, as shown in FIG. 28B, the first wafer W1 and the second wafer W2, which is the Ge-pMOS, are bonded to each other. A laser absorption layer P4 made of an oxide film ($SiO_2$ film), the device layer D2 made of Ge and the front surface film F2 are stacked on the front surface W2a of the second wafer W2 in this order from the second wafer W2.

Thereafter, as shown in FIG. 28B, the first wafer W1 and the second wafer W2 are bonded to each other. Specifically, the front surface film F1 and the front surface film F2 are bonded to each other.

Figure 28C:
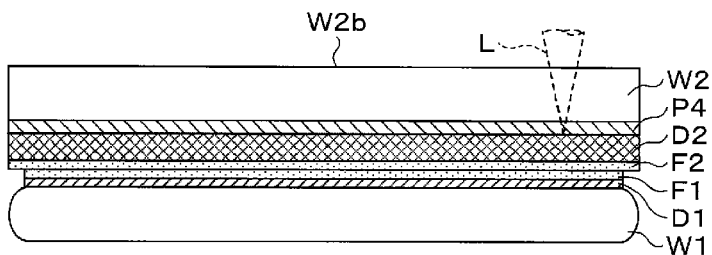

Then, in the laser radiation device 31 of the wafer processing system 1, the laser beam L is radiated in the pulse shape from the laser radiation unit 110 to the interface between the laser absorption layer P4 and the device layer D2 as shown in FIG. 28C. Thereafter, the laser beam L causes the separation at the interface between the laser absorption layer P4 and the device layer D2.

Figure 28D:
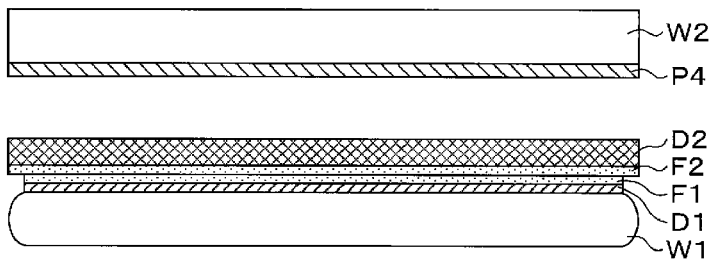

Subsequently, in a state where the transfer pad 120 attracts and holds the rear surface W2b of the second wafer W2, the transfer pad 120 is raised as shown in FIG. 28D to separate the laser absorption layer P4 from the device layer D2. In the present exemplary embodiment as well, the separation position of the laser absorption layer P4 may be adjusted by adjusting the absorption position of the laser beam L, i.e., the separation position of the laser absorption layer P4, as in the case shown in FIG. 24A and FIG. 24B, and the separation may occur at the interface between the second wafer W2 and the laser absorption layer P4.

Any of the processing targets shown in FIG. 25A to FIG. 28D can achieve the same effects as obtained in above-described exemplary embodiments.

Figure 29:
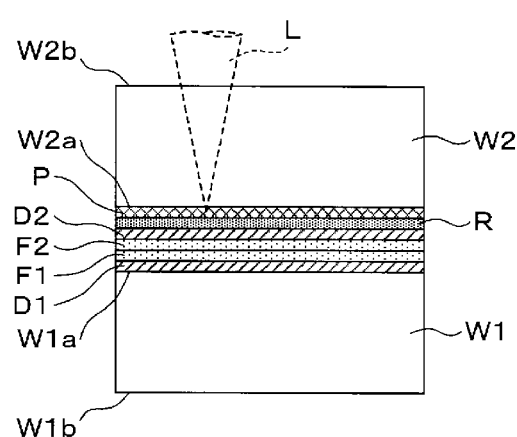
FIG. 29 is a side view schematically illustrating a configuration of a combined wafer according to another exemplary embodiment.

In the combined wafer T processed in the above-described exemplary embodiment, a reflective film R may be provided between the laser absorption layer P and the device layer D2 as shown in FIG. 29. That is, the reflective film R is formed on a surface of the laser absorption layer P opposite to an incident surface of the laser beam L. As the reflective film R, a material, e.g., a metal film, having a high reflectance to the laser beam L and a high melting point is used. The device layer D2 is a functional layer and is different from the reflective film R.

In this case, the laser beam L output from the laser radiation unit 110 is transmitted through the second wafer W2 and is almost completely absorbed by the laser absorption layer P. However, even if there is a laser beam L that cannot be completely absorbed, the laser beam L is reflected by the reflective film R. As a result, the laser beam L does not reach the device layer D2. Therefore, it is possible to reliably suppress damage to the device layer D2.

Further, the laser beam L reflected by the reflective film R is absorbed by the laser absorption layer P. Therefore, it is possible to improve the separation efficiency of the second wafer W2.

The exemplary embodiments disclosed herein are illustrative in all aspects and do not limit the present disclosure. The above-described exemplary embodiments may be omitted, replaced and modified in various ways without departing from the scope and the spirit of the appended claims.

According to the present disclosure, in the combined substrate in which the first substrate and the second substrate are bonded to each other, the device layer formed on the surface of the second substrate can be appropriately transferred to the first substrate.

We claim:

1. A substrate processing method of transferring, in a combined substrate in which a first substrate and a second substrate are bonded to each other, a device layer formed on a surface of the second substrate to the first substrate,
   wherein a laser beam is radiated in a pulse shape from a rear surface side of the second substrate to a laser absorption layer formed between the second substrate and the device layer,
   wherein the laser beam is radiated to an outer peripheral portion of the laser absorption layer while the combined substrate is rotated, and
   wherein a central portion on an inner side of the outer peripheral portion of the laser absorption layer in a diametrical direction is scanned with the laser beam in a state where rotation of the combined substrate is stopped.

2. The substrate processing method of claim 1,
   wherein while the combined substrate is rotated, the laser beam is radiated from an outer side to an inner side of the laser absorption layer in a diametrical direction.

3. The substrate processing method of claim 2,
   wherein a rotation speed of the combined substrate is higher when the laser beam is radiated to the inner side of the laser absorption layer in the diametrical direction than when the laser beam is radiated to the outer side.

4. The substrate processing method of claim 2,
   wherein a frequency of the laser beam is higher when the laser beam is radiated to the outer side of the laser absorption layer in the diametrical direction than when the laser beam is radiated to the inner side.

5. The substrate processing method of claim 2,
wherein radiation of the laser beam starts between an outer edge of the second substrate and a bonding edge between the first substrate and the second substrate in the combined substrate.

6. The substrate processing method of claim 1, further comprising:
scanning the laser absorption layer with the laser beam radiated to the laser absorption layer; and
moving the combined substrate,
wherein the scanning of the laser absorption layer with the laser beam and the moving of the combined substrate are repeatedly performed.

7. The substrate processing method of claim 1,
wherein while the combined substrate is moved, the laser absorption layer is scanned with the laser beam radiated to the laser absorption layer.

8. The substrate processing method of claim 1,
wherein an absorption position of the laser beam in the laser absorption layer is adjusted by controlling an energy density of the laser beam.

9. The substrate processing method of claim 1,
wherein when the laser beam is radiated to the laser absorption layer, the laser beam is oscillated in the pulse shape from a laser oscillator toward an optical element, and the optical element adjusts a frequency of the laser beam.

10. The substrate processing method of claim 9,
wherein a pulse waveform of the laser beam from the laser oscillator is identical to a pulse waveform of the laser beam radiated to the laser absorption layer.

11. The substrate processing method of claim 9,
wherein a frequency of the laser beam from the laser oscillator is a highest frequency that is allowed to be controlled by the optical element.

12. The substrate processing method of claim 9,
wherein when the laser beam is radiated to the laser absorption layer, an attenuator attenuates the laser beam from the laser oscillator.

13. The substrate processing method of claim 1,
wherein a reflective film is formed on a surface of the laser absorption layer opposite to an incident surface of the laser beam,
in the laser beam radiated to the laser absorption layer, the laser beam not absorbed by the laser absorption layer is reflected by the reflective film, and
the laser beam reflected by the reflective film is absorbed by the laser absorption layer.

14. A substrate processing apparatus configured to transfer, in a combined substrate in which a first substrate and a second substrate are bonded to each other, a device layer formed on a surface of the second substrate to the first substrate, the substrate processing apparatus comprising:
a holder configured to hold a rear surface of the first substrate;
a laser radiation unit configured to radiate a laser beam in a pulse shape from a rear surface side of the second substrate to a laser absorption layer formed between the second substrate and the device layer in a state where the holder holds the first substrate; and
a motor configured to rotate the holder;
a slider configured to move the holder; and
a controller and a storage storing a computer program, wherein the storage and the computer program are configured, with the controller, to control the motor, the slider and the laser radiation unit,
wherein the laser radiation unit radiates the laser beam to the laser absorption layer while scanning the laser absorption layer with the laser beam, and
wherein the controller controls the motor, the slider and the laser radiation unit to radiate the laser beam to an outer peripheral portion of the laser absorption layer while the combined substrate is rotated and to scan a central portion on an inner side of the outer peripheral portion of the laser absorption layer in a diametrical direction with the laser beam in a state where rotation of the combined substrate is stopped.

15. The substrate processing apparatus of claim 14,
wherein the controller controls the motor and the laser radiation unit to radiate the laser beam from an outer side to an inner side of the laser absorption layer in a diametrical direction while the holder holding the combined substrate is rotated.

16. The substrate processing apparatus of claim 15,
wherein the controller controls the motor and the laser radiation unit to radiate the laser beam in a spiral shape to the laser absorption layer.

17. The substrate processing apparatus of claim 15,
wherein the controller controls the motor and the laser radiation unit to make a rotation speed of the combined substrate higher when the laser beam is radiated to the inner side of the laser absorption layer in the diametrical direction than when the laser beam is radiated to the outer side.

18. The substrate processing apparatus of claim 15,
wherein the controller controls the motor and the laser radiation unit to make a frequency of the laser beam higher when the laser beam is radiated to the outer side of the laser absorption layer in the diametrical direction than when the laser beam is radiated to the inner side.

19. The substrate processing apparatus of claim 15,
wherein the controller controls the laser radiation unit to start radiation of the laser beam between an outer edge of the second substrate and a bonding edge between the first substrate and the second substrate in the combined substrate.

20. The substrate processing apparatus of claim 14,
wherein the laser radiation unit radiates the laser beam to the laser absorption layer while scanning the laser absorption layer with the laser beam, and
the controller controls the slider and the laser radiation unit to sequentially and repeatedly perform scanning the laser absorption layer with the laser beam radiated to the laser absorption layer and moving the holder.

21. The substrate processing apparatus of claim 14,
wherein the laser radiation unit radiates the laser beam to the laser absorption layer while scanning the laser absorption layer with the laser beam, and
the controller controls the slider and the laser radiation unit to scan the laser absorption layer with the laser beam radiated to the laser absorption layer while moving the holder.

22. The substrate processing apparatus of claim 14,
wherein the controller adjusts an absorption position of the laser beam in the laser absorption layer by controlling an energy density of the laser beam.

23. The substrate processing apparatus of claim 14, further comprising:
wherein the laser radiation unit includes:
a laser oscillator configured to oscillate the laser beam in the pulse shape; and
an optical element configured to divert the laser beam from the laser oscillator in a different direction, and wherein the controller controls the optical element to adjust a frequency of the laser beam radiated to the laser absorption layer.

24. The substrate processing apparatus of claim 23, wherein a pulse waveform of the laser beam from the laser oscillator is identical to a pulse waveform of the laser beam radiated to the laser absorption layer.

25. The substrate processing apparatus of claim 23, wherein a frequency of the laser beam from the laser oscillator is a highest frequency that is allowed to be controlled by the optical element.

26. The substrate processing apparatus of claim 23, wherein the laser radiation unit includes an attenuator configured to attenuate the laser beam from the laser oscillator.

27. The substrate processing apparatus of claim 23, wherein the optical element is an acousto-optic modulator.

* * * * *